(12) United States Patent
Pan et al.

(10) Patent No.: US 11,500,064 B2
(45) Date of Patent: Nov. 15, 2022

(54) KINEMATIC MOUNT FOR ACTIVE MEMS ALIGNMENT WITH MULTI-DEGREE-OF-FREEDOM COMPRISING PLURAL SPRING-LOADED POSTS

(71) Applicant: BEIJING VOYAGER TECHNOLOGY CO., LTD., Beijing (CN)

(72) Inventors: Anan Pan, Mountain View, CA (US); Henghui Jiang, Mountain View, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 298 days.

(21) Appl. No.: 16/881,931

(22) Filed: May 22, 2020

(65) Prior Publication Data

US 2021/0364601 A1     Nov. 25, 2021

(51) Int. Cl.

| | |
|---|---|
| *G01S 17/88* | (2006.01) |
| *G01S 7/481* | (2006.01) |
| *H05K 1/18* | (2006.01) |
| *G01S 17/10* | (2020.01) |
| *G01S 17/931* | (2020.01) |

(52) U.S. Cl.
CPC .......... *G01S 7/4811* (2013.01); *G01S 7/4817* (2013.01); *G01S 17/10* (2013.01); *H05K 1/181* (2013.01); *G01S 17/931* (2020.01); *H05K 2201/10121* (2013.01); *H05K 2201/10265* (2013.01); *H05K 2201/10409* (2013.01); *H05K 2201/10424* (2013.01)

(58) Field of Classification Search
CPC ........ G01S 17/88; G01S 17/894; G01S 17/93; G01S 17/06; G01S 17/04; G01S 17/48; H05K 1/18
USPC ....................................................... 250/239
See application file for complete search history.

(56) References Cited

U.S. PATENT DOCUMENTS 10,962,570 B2 *   3/2021   Leung .................... H01R 13/02

\* cited by examiner

*Primary Examiner* — Que Tan Le
(74) *Attorney, Agent, or Firm* — Bayes PLL

(57) ABSTRACT

A MEMS board assembly, a LiDAR system including the same, and a method for making the same are disclosed. The exemplary MEMS board assembly includes a MEMS board having a plurality of through holes and a mount having a plurality of threaded holes. The MEMS board assembly further includes a plurality of spring-loaded posts each formed by fitting a spring into a respective post. The plurality of spring-loaded posts are fitted into the plurality of threaded holes of the mount. The MEMS board assembly also includes a plurality of screws fitting the MEMS board to the mount by reaching into the plurality of threaded holes of the mount through the plurality of through holes in the MEMS board and the plurality of spring-loaded posts. The MEMS board touches the plurality of spring-loaded posts at the plurality of through holes in the MEMS board corresponding to the plurality of threaded holes of the mount respectively.

20 Claims, 34 Drawing Sheets

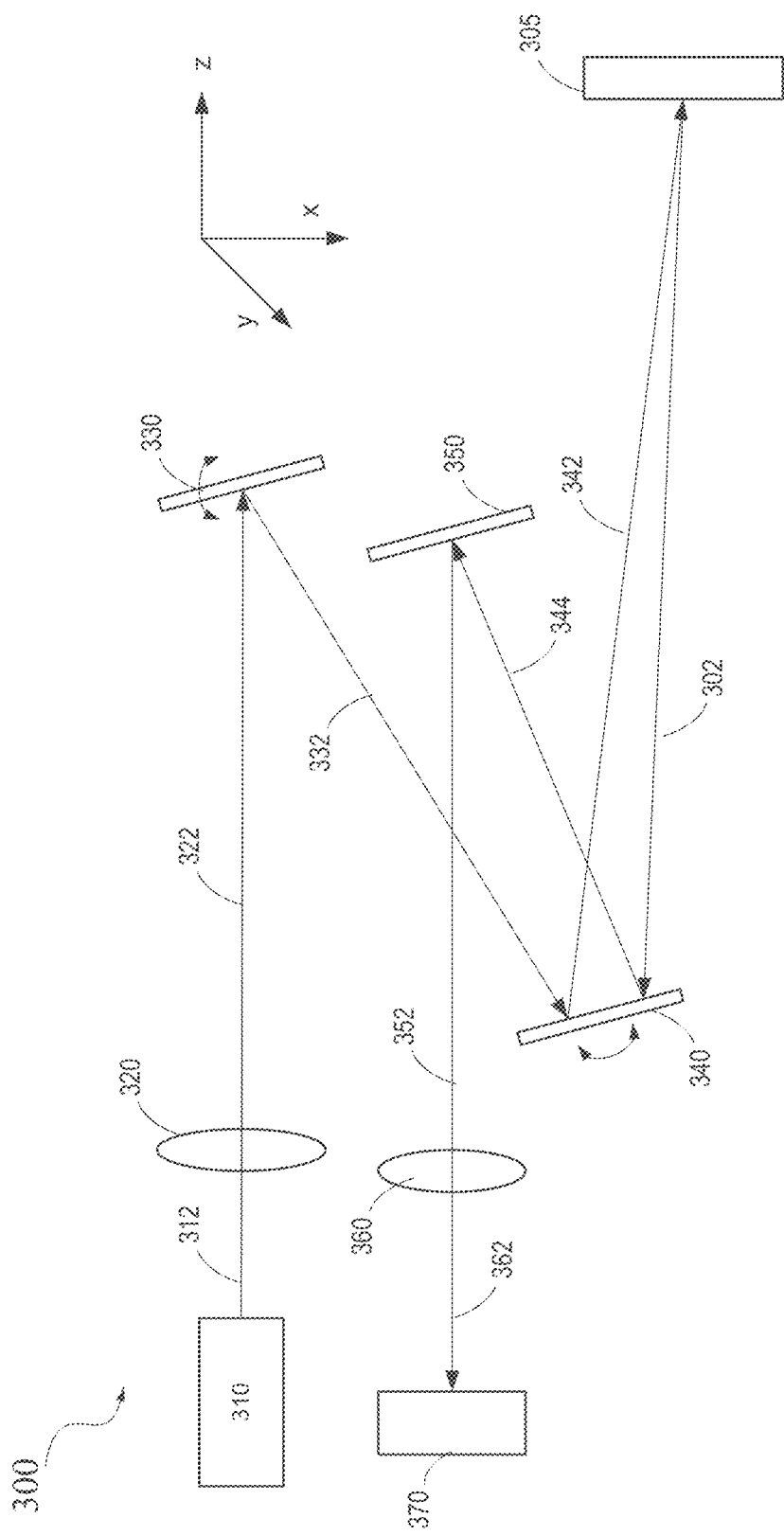

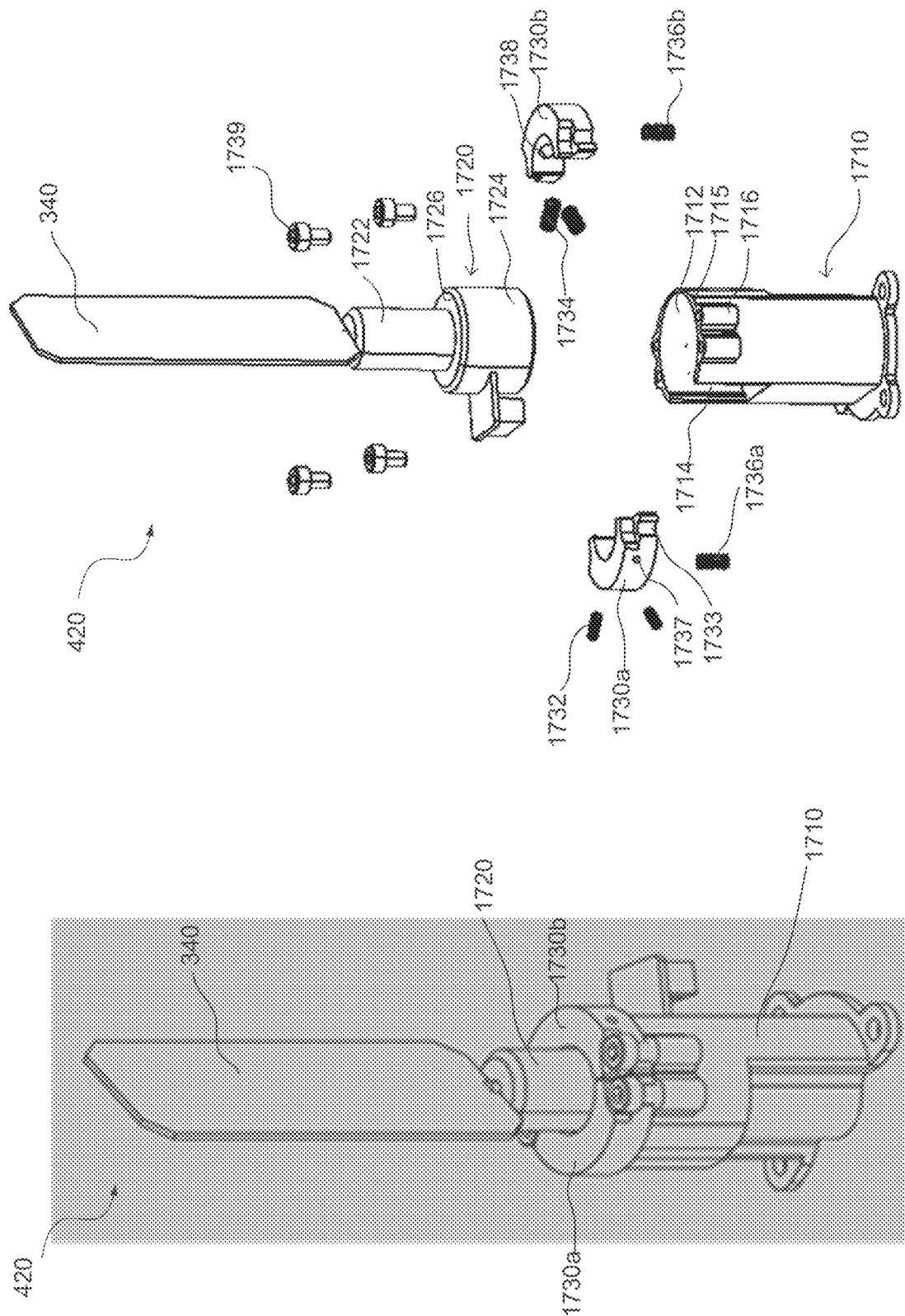

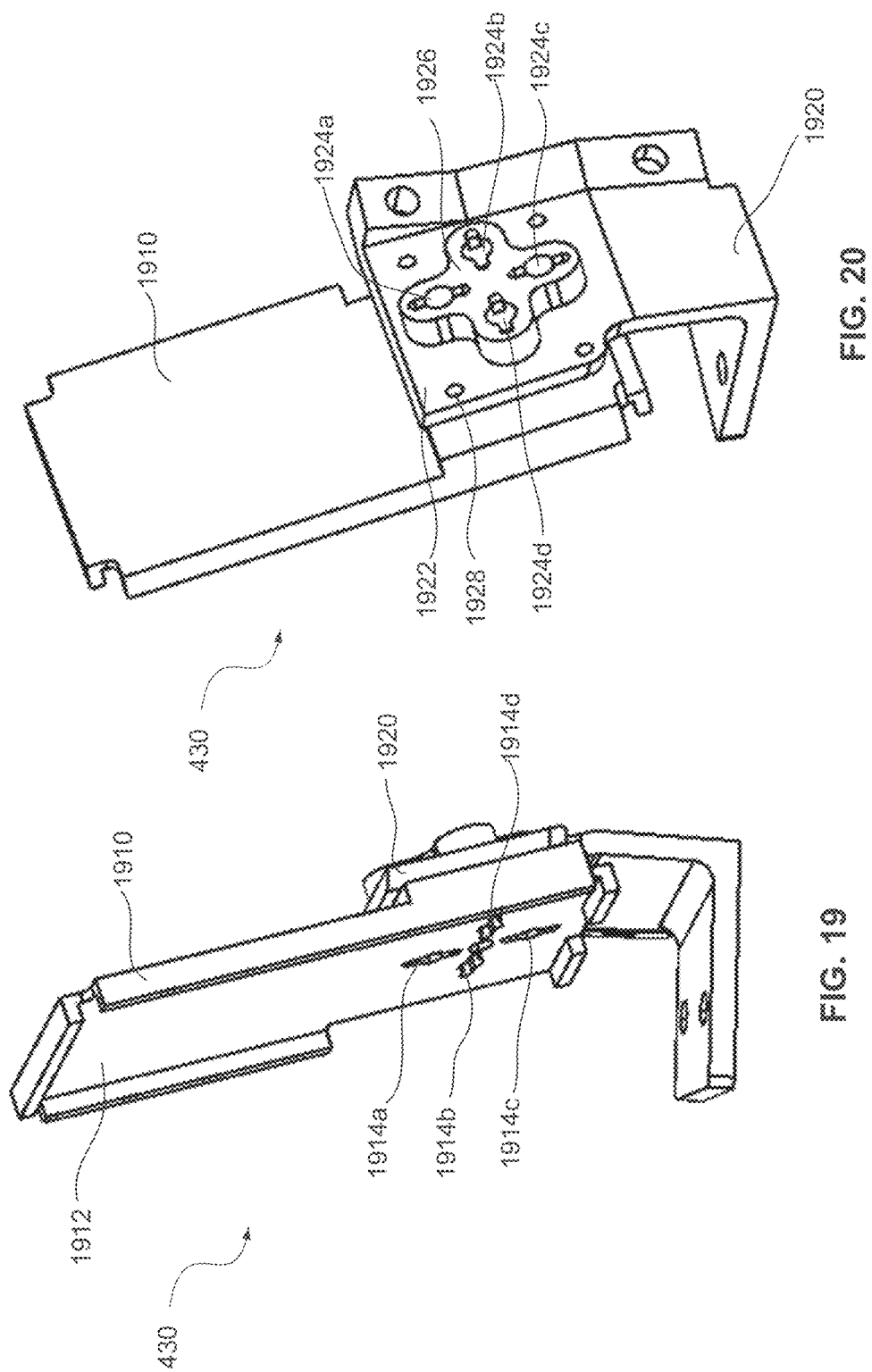

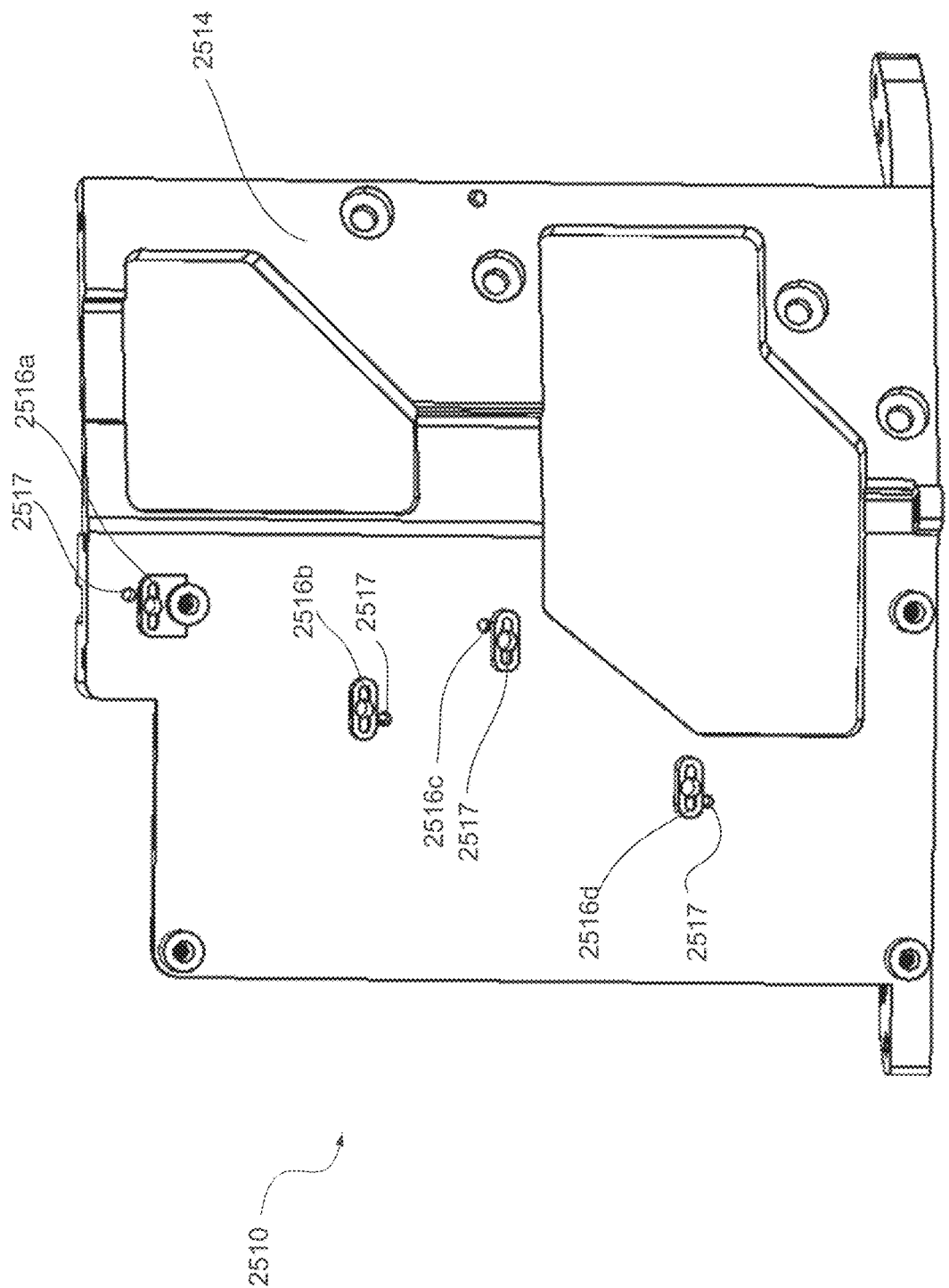

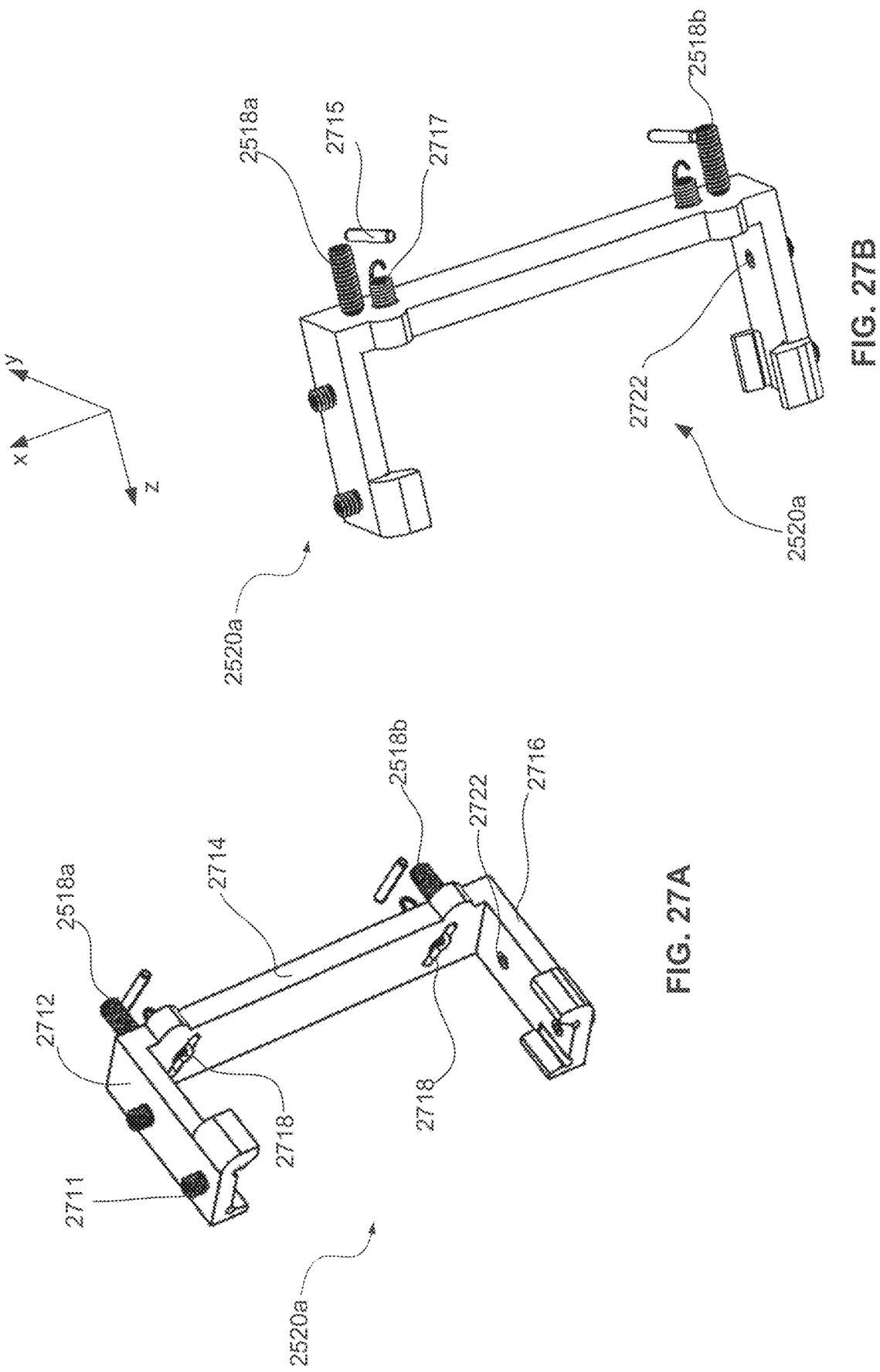

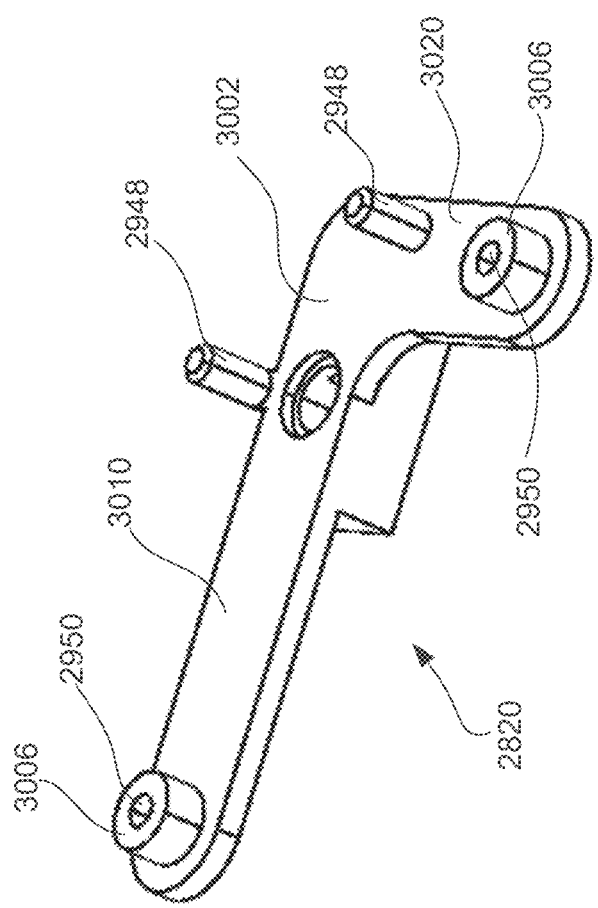

KINEMATIC MOUNT FOR ACTIVE MEMS ALIGNMENT WITH MULTI-DEGREE-OF-FREEDOM COMPRISING PLURAL SPRING-LOADED POSTS

CROSS-REFERENCES TO RELATED APPLICATIONS

This is a continuation-in-part application of U.S. patent application Ser. No. 16/728,936, filed on Dec. 27, 2019, the content of which is incorporated by reference into this application.

BACKGROUND

Modern vehicles are often equipped with sensors designed to detect objects and landscape features around the vehicle in real-time to enable technologies such as lane change assistance, collision avoidance, and autonomous driving. Some commonly used sensors include image sensors (e.g., infrared or visible light cameras), acoustic sensors (e.g., ultrasonic parking sensors), radio detection and ranging (RADAR) sensors, magnetometers (e.g., passive sensing of large ferrous objects, such as trucks, cars, or rail cars), and light detection and ranging (LiDAR) sensors.

A LiDAR system typically uses a light source and a light detection system to estimate distances to environmental features (e.g., pedestrians, vehicles, structures, plants, etc.). For example, a LiDAR system may transmit a light beam (e.g., a pulsed laser beam) to illuminate a target and measure the time it takes for the transmitted light beam to arrive at the target and then return to a receiver (e.g., a photodetector) near the transmitter or at a known location. In some LiDAR systems, the light beam emitted by the light source may be steered across a region of interest according to a scanning pattern to generate a "point cloud" that includes a collection of data points corresponding to target points in the region of interest. The data points in the point cloud may be dynamically and continuously updated, and may be used to estimate, for example, a distance, dimension, and location of an object relative to the LiDAR system, often with very high fidelity (e.g., within about 5 cm).

In some implementations, the light beam emitted from the light source may be steered using mirrors, such as galvo mirror scanners and/or micro-electro-mechanical system (MEMS) mirrors. The returned light beam may be directed to the photodetector using optical components, such as mirrors, prisms, and lenses. The alignment of the various optical components on the light path may significantly impact the accuracy and other performance of the LiDAR system. During manufacturing of the LiDAR, the relative positions of the various optical components are first adjusted for proper alignment. These components are then fixed, e.g., by applying glues therebetween. This final fixing step can be challenging because massive glue may be applied to fill the clearance between the components (e.g., between a MEMS driver board and board mount), which leads to the instability of the whole application process. In addition, because glue shrinks, it may cause the components to move out from their well aligned positions.

In order to reduce the amount of filling materials, such as glue, applied, some existing manufacturing methods first use fixture to help align MEMS, and then use customized screws and nuts to slowly approach MEMS driver board till glue can be applied between screws/nuts and board to fix it. However, such methods are time consuming and impose high requirement on the operators because the action of securing screws or nuts may cause mis-operation to move MEMS. Some other methods attempt to decrease the clearance between MEMS driver board and mount. But these methods also sacrifice alignment angles. The systems and methods disclosed in the present disclosure are designed to address the above discussed issues with the existing manufacturing methods.

SUMMARY

Techniques disclosed herein relate generally to light detection and ranging (LiDAR) systems. More specifically, and without limitation, disclosed herein are techniques for accurately aligning components in a LiDAR system. In particular, techniques disclosed herein relate to mechanical mounts with multiple degrees of freedom for adjusting positions of small optical components in a compact LiDAR system that has limited space. Various inventive embodiments are described herein, including devices, units, subsystems, modules, systems, methods, and the like.

Certain embodiments of the disclosure are directed to a MEMS board assembly. The exemplary MEMS board assembly includes a MEMS board having a plurality of through holes and a mount having a plurality of threaded holes. The MEMS board assembly further includes a plurality of spring-loaded posts each formed by fitting a spring into a respective post. The plurality of spring-loaded posts are fitted into the plurality of threaded holes of the mount. The MEMS board assembly also includes a plurality of screws fitting the MEMS board to the mount by reaching into the plurality of threaded holes of the mount through the plurality of through holes in the MEMS board and the plurality of spring-loaded posts. The MEMS board touches the plurality of spring-loaded posts at the plurality of through holes in the MEMS board corresponding to the plurality of threaded holes of the mount respectively.

Certain embodiments of the disclosure are directed to a MEMS board assembly made by a method for aligning a MEMS board with a mount. The method includes fitting a plurality of spring-loaded posts into a plurality of threaded holes of the mount respectively. Each spring-loaded post is formed by fitting a spring into a respective post. The method further includes fitting the MEMS board to the mount with a plurality of screws reaching into the plurality of threaded holes of the mount through a plurality of through holes in the MEMS board and the plurality of spring-loaded posts. The method also includes adjusting the MEMS board to a target position by turning the plurality of screws.

Certain embodiments of the disclosure are directed to a LiDAR system. The exemplary LiDAR system includes a transmitter configured to emit a light beam to scan an object and a receiver configured to detect the light beam returned by the object. At least one of the transmitter or the receiver includes a MEMS board assembly. The MEMS board assembly includes a MEMS board having a plurality of through holes and a mount having a plurality of threaded holes. The MEMS board assembly further includes a plurality of spring-loaded posts each formed by fitting a spring into a respective post. The plurality of spring-loaded posts are fitted into the plurality of threaded holes of the mount. The MEMS board assembly also includes a plurality of screws fitting the MEMS board to the mount by reaching into the plurality of threaded holes of the mount through the plurality of through holes in the MEMS board and the plurality of spring-loaded posts. The MEMS board touches the plurality of spring-loaded posts at the plurality of through holes in the MEMS board corresponding to the plurality of threaded holes of the mount respectively.

The terms and expressions that have been employed are used as terms of description and not of limitation, and there is no intention in the use of such terms and expressions of excluding any equivalents of the features shown and described or portions thereof. It is recognized, however, that various modifications are possible within the scope of the systems and methods claimed. Thus, it should be understood that, although the present system and methods have been specifically disclosed by examples and optional features, modification and variation of the concepts herein disclosed should be recognized by those skilled in the art, and that such modifications and variations are considered to be within the scope of the systems and methods as defined by the appended claims.

This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

Aspects and features of the various embodiments will be more apparent by describing examples with reference to the accompanying drawings, in which like reference numerals refer to like components or parts throughout the drawings.

FIG. 2A illustrates an example of a beam steering operation by the LiDAR system. FIG. 2B illustrates an example of a return beam detection operation by the LiDAR system.

FIG. 3 is a simplified diagram of an example of an optical subsystem in a LiDAR system according to certain embodiments.

FIG. 16 shows a perspective view of a mirror assembly according to certain embodiments.

FIG. 17 shows an exploded view of the mirror assembly shown in FIG. 16.

FIG. 19 illustrates a perspective view of an example of a mirror assembly according to certain embodiments.

FIG. 20 illustrates a perspective view of the mirror assembly shown in FIG. 19.

FIGS. 26A and 26B illustrate an example of a carrier frame for mounting lenses and photodetectors according to certain embodiments.

FIGS. 27A and 27B illustrate an example of lens mount in different perspective views according to certain embodiments.

FIG. 30 illustrates an example of a board mount in a perspective view according to certain embodiments.

DETAILED DESCRIPTION

Figure 1:
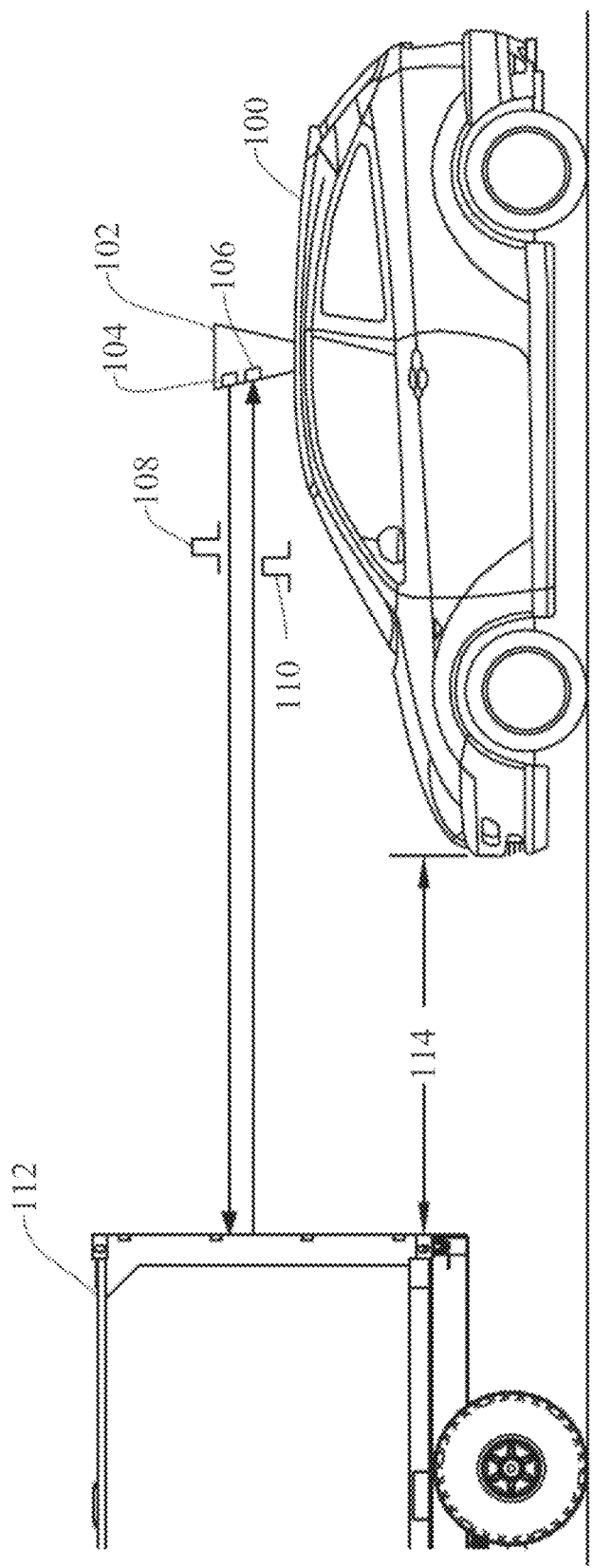
FIG. 1 illustrates an example of a vehicle including a LiDAR-based detection system according to certain embodiments.

Techniques disclosed herein relate generally to light detection and ranging (LiDAR) systems, and more specifically, to techniques for accurately aligning components in a LiDAR systems. In particular, techniques disclosed herein relate to mechanical mounts with multiple (e.g., 1-5) degrees of freedom for adjusting positions of small optical components in a compact LiDAR system that has limited space. Various inventive embodiments are described herein, including devices, units, subsystems, modules, systems, methods, and the like.

In a LiDAR system, the relative position or alignment of various optical components on the light path, such as light sources, lenses, reflectors, and photodetectors, may significantly impact the accuracy and other performance of the LiDAR system. For example, a small offset in the orientation of a beam steering mirror may cause a large offset in the scanning point in the far field, and thus inaccurate information may be measured for target points. Therefore, during assembly and maintenance, the optical components may need to be fine-tuned to align properly. The fine-tuning of the optical components may be performed using mechanical mounts with multiple degrees of freedom, such as translations in x, y, and z directions and rotations around x axis (pitch), around y axis (roll), and around z axis (yaw). Existing mechanical mounts with multiple degrees of freedom may be complicate and bulky, or may lack the desired degrees of freedom and/or accuracy. In a compact LiDAR system, such as a LiDAR system used in a vehicle, the distances between at least some optical components may be small. Therefore, the mechanical mounts for the optical components may need to be small in order to fit in the compact LiDAR system. Thus, existing mechanical mounts may not be suitable for use in compact LiDAR systems with limited space between optical components.

According to certain embodiments disclosed herein, a LiDAR transmitter may include an extending arm configured to support and position a light source and a light beam collimator in a coaxial configuration, and an optical scanner assembly. The optical scanner assembly may include a scanner board for installing an optical scanner thereon, a mechanical mount, a first set of three or more adjustable connectors coupling the scanner board to the mechanical mount, and a first set of elastic members between the mechanical mount and the scanner board and sleeved on the first set of three or more adjustable connectors. The LiDAR transmitter may also include a second set of adjustable connectors coupling the mechanical mount to the extending arm such that the optical scanner is in a position to receive a light beam emitted by the light source and collimated by the light beam collimator. The LiDAR transmitter may also include a second set of elastic members between the mechanical mount and the extending arm and sleeved on the second set of adjustable connectors. The optical scanner may include, for example, a micro-electro-mechanical system (MEMS) mirror.

In the following description, for the purposes of explanation, specific details are set forth in order to provide a thorough understanding of examples of the disclosure. It will be apparent that various examples may be practiced without these specific details. The ensuing description provides examples only, and is not intended to limit the scope, applicability, or configuration of the disclosure. Rather, the ensuing description of the examples will provide those skilled in the art with an enabling description for implementing an example. It should be understood that various changes may be made in the function and arrangement of elements without departing from the spirit and scope of the disclosure as set forth in the appended claims. The figures and description are not intended to be restrictive. Circuits, systems, networks, processes, and other components may be shown as components in block diagram form in order not to obscure the examples in unnecessary detail. In other instances, well-known circuits, processes, algorithms, structures, and techniques may be shown without unnecessary detail in order to avoid obscuring the examples. The teachings disclosed herein can also be applied to various types of applications such as mobile applications, non-mobile application, desktop applications, web applications, enterprise applications, and the like. Further, the teachings of this disclosure are not restricted to a particular operating environment (e.g., operating systems, devices, platforms, and the like) but instead can be applied to multiple different operating environments.

Furthermore, examples may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a machine-readable medium. A processor(s) may perform the necessary tasks.

Also, it is noted that individual examples may be described as a process which is depicted as a flowchart, a flow diagram, a data flow diagram, a structure diagram, or a block diagram. Although a flowchart may describe the operations as a sequential process, many of the operations may be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination may correspond to a return of the function to the calling function or the main function.

Where components are described as being "configured to" perform certain operations, such configuration may be accomplished, for example, by designing electronic circuits or other hardware to perform the operation, by programming or controlling electronic circuits (e.g., microprocessors, or other suitable electronic circuits) to perform the operation, or any combination thereof.

The word "example" or "exemplary" is used herein to mean "serving as an example, instance, or illustration." Any embodiment or design described herein as "exemplary" or "example" is not necessarily to be construed as preferred or advantageous over other embodiments or designs.

I. Lidar System

A LiDAR system is an active remote sensing system that can be used to obtain the range from a transmitter to one or more points on a target in a field of view. A LiDAR system uses a light beam, typically a laser beam, to illuminate the one or more points on the target. Compared with other light sources, a laser beam may propagate over long distances without spreading significantly (highly collimated), and can be focused to small spots so as to deliver high optical power densities and provide fine resolution. The laser beam may be modulated such that the transmitted laser beam may include a series of pulses. The transmitted laser beam may be directed to a point on the target, which may reflect or scatter the transmitted laser beam. The laser beam reflected or scattered from the point on the target to the LiDAR system can be measured, and the time of flight (ToF) from the time a pulse of the transmitted light beam is transmitted from the transmitter to the time the pulse arrives at a receiver near the transmitter or at a known location may be measured. The range from the transmitter to the point on the target may then be determined by, for example, $r = c \times t/2$, where r is the range from the transmitter to the point on the target, c is the speed of light in free space, and t is the ToF of the pulse of the light beam from the transmitter to the receiver.

A LiDAR system may include, for example, a single-point scanning system or a single-pulse flash system. A single-point scanning system may use a scanner to direct a pulsed light beam (e.g., pulsed laser beam) to a single point in the field of view at a time and measure the reflected or backscattered light beam with a photodetector. The scanner may then slightly tilt the pulsed light beam to illuminate the next point, and the process may be repeated to scan the full field of view. A flash LiDAR system, on the other hand, may transmit a wider-spread light beam and use a two dimensional array of photodiodes (e.g., a focal-plane array (FPA)) to measure the reflected or backscattered light at several points simultaneously. Due to the wider beam spread, a flash LiDAR system may scan a field of view faster than a single-point scanning system, but may need a much more powerful light source to illuminate a larger area.

FIG. 1 illustrates an example of a vehicle 100 including a LiDAR-based detection system according to certain embodiments. Vehicle 100 may include a LiDAR system 102. LiDAR system 102 may allow vehicle 100 to perform object detection and ranging in the surrounding environment. Based on the result of the object detection and ranging, vehicle 100 may, for example, automatically maneuver (with little or no human intervention) to avoid a collision with an object in the environment. LiDAR system 102 may include a transmitter 104 and a receiver 106. Transmitter 104 may direct one or more light pulses 108 (or a frequency modulated continuous wave (FMCW) light signal, an amplitude modulated continuous wave (AMCW) light signal, etc.), at various directions at different times according to a suitable scanning pattern, while receiver 106 may detect returned light pulses 110 which may be portions of transmitted light pulses 108 that are reflected or scattered by one or more areas on one or more objects. LiDAR system 102 may detect the object based on the detected light pulses 110, and may also determine a range (e.g., a distance) of each area on the detected objects based on a time difference between the transmission of a light pulse 108 and the reception of a corresponding light pulse 110, which is referred to as the time of flight. Each area on a detected object may be represented by a data point that is associated with a 2-D or 3-D direction and distance with respect to LiDAR system 102.

The above-described operations can be repeated rapidly for many different directions. For example, the light pulses can be scanned using various scanning mechanisms (e.g., spinning mirrors or MEMS devices) according to a one-dimensional or two-dimensional scan pattern for two-dimensional or three-dimensional detection and ranging. The collection of the data points in the 2-D or 3-D space may form a "point cloud," which may indicate, for example, the direction, distance, shape, and dimensions of a detected object relative to the LiDAR system.

In the example shown in FIG. 1, LiDAR system 102 may transmit light pulse 108 in a direction directly in front of vehicle 100 at time T1 and receive a returned light pulse 110 that is reflected by an object 112 (e.g., another vehicle) at time T2. Based on the detection of light pulse 110, LiDAR system 102 may determine that object 112 is directly in front of vehicle 100. In addition, based on the time difference between T1 and T2, LiDAR system 102 may determine a distance 114 between vehicle 100 and object 112. LiDAR system 102 may also determine other useful information, such as a relative speed and/or acceleration between two vehicles and/or the dimensions of the detected object (e.g., the width or height of the object), based on additional light pulses detected. As such, vehicle 100 may be able to adjust its speed (e.g., slowing down, accelerating, or stopping) to avoid collision with other objects, or may be able to control other systems (e.g., adaptive cruise control, emergency brake assist, anti-lock braking systems, or the like) based on the detection and ranging of objects by LiDAR system 102.

Figure 2A:
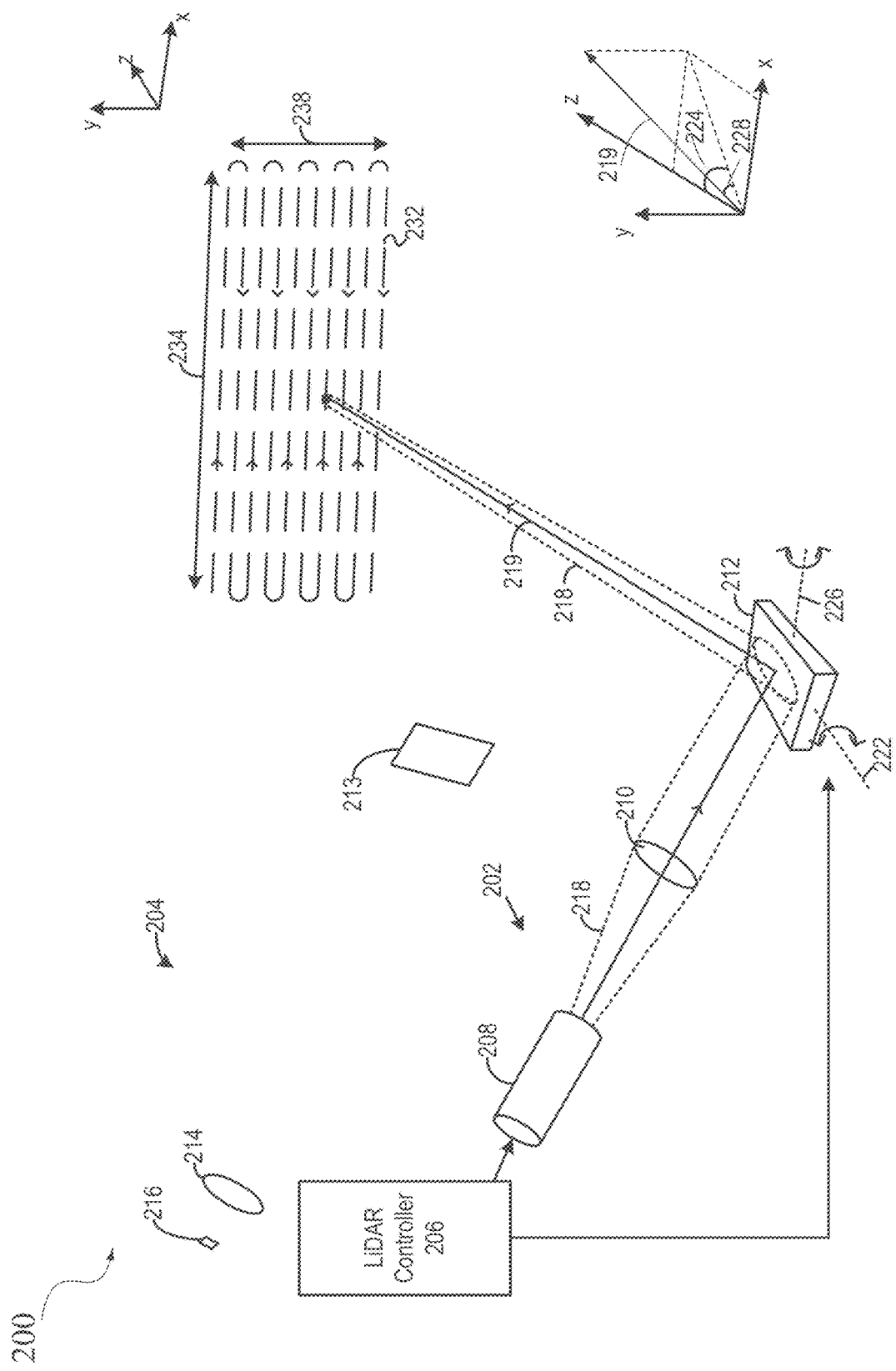
FIGS. 2A and 2B illustrated an example of a LiDAR system according to certain embodiments.
Figure 2B:
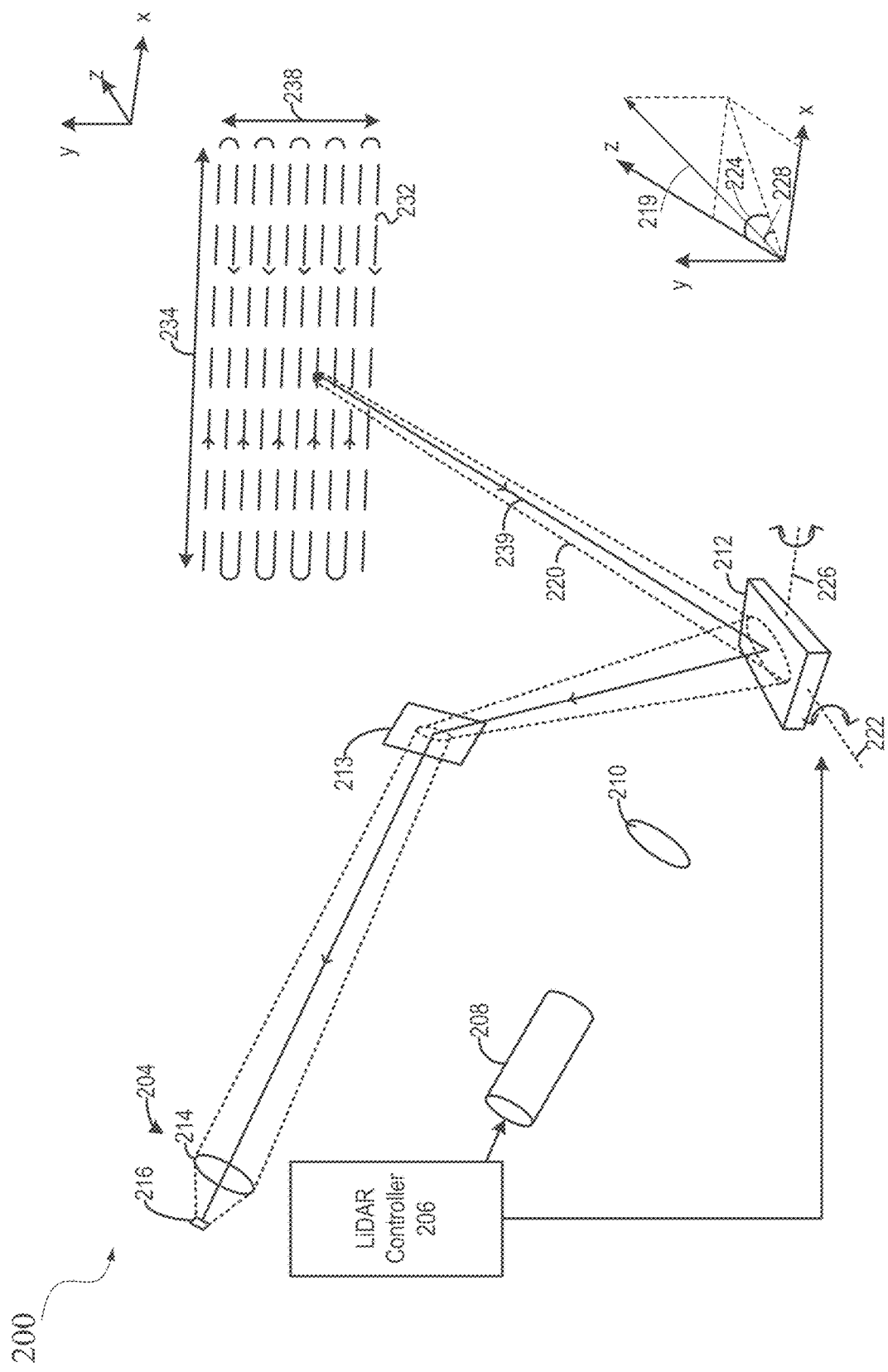

FIG. 2A and FIG. 2B illustrate simplified block diagram of an example of a LiDAR module 200 according to certain embodiments. LiDAR module 200 may be an example of LiDAR system 102, and may include a transmitter 202, a receiver 204, and a LiDAR controller 206 that controls the operations of transmitter 202 and receiver 204. Transmitter 202 may include a light source 208 and a collimator lens 210, whereas receiver 204 may include a lens 214 and a photodetector 216. LiDAR module 200 may further include a mirror assembly 212 and a beam deflector 213. In some embodiments, transmitter 202 and receiver 204 may be configured to share mirror assembly 212 to perform light steering and detecting operation, with beam deflector 213 configured to reflect incident light reflected by mirror assembly 212 to receiver 204. In some embodiments, beam deflector 213 may be shared by transmitter 202 and receiver 204, where light from light source 208 and reflected by mirror assembly 212 may be further reflected by beam deflector 213, while the returned beam may be deflected by beam deflector 213 to lens 214 and photodetector 216.

FIG. 2A illustrates an example of a beam steering operation by LiDAR module 200. To project light, LiDAR controller 206 can control light source 208 to transmit a light beam 218 (e.g., light pulses 108, an FMCW light signal, an AMCW light signal, etc.). Light beam 218 may diverge upon leaving light source 208 and may be collimated by collimator lens 210. Collimated light beam 218 may propagate with substantially the same beam size.

Collimated light beam 218 may be incident upon mirror assembly 212, which can reflect and steer the light beam along an output projection path 219 towards a field of interest, such as object 112. Mirror assembly 212 may include one or more rotatable mirrors, such as a one-dimensional or two-dimensional array of micro-mirrors. Mirror assembly 212 may also include one or more actuators (not shown in FIG. 2A) to rotate the rotatable mirrors. The actuators may rotate the rotatable mirrors around a first axis 222, and/or may rotate the rotatable mirrors around a second axis 226. The rotation around first axis 222 may change a first angle 224 (e.g., longitude angle) of output projection path 219 with respect to a first dimension (e.g., the x-axis), whereas the rotation around second axis 226 may change a second angle 228 (e.g., altitude angle) of output projection path 219 with respect to a second dimension (e.g., the y-axis). LiDAR controller 206 may control the actuators to produce different combinations of angles of rotation around first axis 222 and second axis 226 such that the movement of output projection path 219 can follow a scanning pattern 232. A range 234 of movement of output projection path 219 along the x-axis, as well as a range 238 of movement of output projection path 219 along the y-axis, can define a FOV. An object within the FOV, such as object 112, can receive and reflect collimated light beam 218 to form reflected or returned light signal, which can be received by receiver 204.

FIG. 2B illustrates an example of a return beam detection operation by LiDAR module 200. LiDAR controller 206 can select an incident light direction 239 for detection of incident light by receiver 204. The selection can be based on setting the angles of rotation of the rotatable mirrors of mirror assembly 212, such that only light beam 220 propagating along light direction 239 gets reflected to beam deflector 213, which can then divert light beam 220 to photodetector 216 via collimator lens 214. Photodetector 216 may include any suitable high-speed detector that can detect light pulses in the working wavelength of the LiDAR system, such as a PIN photodiode, a silicon photomultiplier (SiPM) sensor, or an InGaAs avalanche photodetector. With such arrangements, receiver 204 can selectively receive signals that are relevant for the ranging/imaging of a target object, such as light pulse 110 generated by the reflection of collimated light beam 218 by object 112, and not to receive other signals. As a result, the effect of environment disturbance on the ranging/imaging of the object can be reduced, and the system performance can be improved.

FIG. 3 is a simplified block diagram of an example of an optical subsystem 300 in a LiDAR system, such as LiDAR system 102 shown in FIG. 1, according to certain embodiments. In some embodiments, a plurality of optical subsystems 300 can be integrated into the LiDAR system to achieve, for example, 360° coverage in the transverse plane. In one example, a LiDAR system may include eight optical subsystems 300 distributed around a circle, where each optical subsystem 300 may have a field of view about 45° in the transverse plane.

In the example shown in FIG. 3, optical subsystem 300 may include a light source 310, such as a laser (e.g., a pulsed laser diode). A light beam 312 emitted by light source 310 may be collimated by a collimation lens 320. The collimated light beam 322 may be incident on a first deflector 330, which may be stationary or may rotate in at least one dimension such that collimated light beam 322 may at least be deflected by first deflector 330 towards, for example, different y locations. Collimated light beam 332 deflected by first deflector 330 may be further deflected by a second deflector 340, which may be stationary or may rotate in at least one dimension. For example, second deflector 340 may rotate and deflect collimated light beam 332 towards different x locations. Collimated light beam 342 deflected by second deflector 340 may reach a target point at a desired (x, y) location on a target object 305. As such, first deflector 330 and second deflector 340 may, alone or in combination, scan the collimated light beam in two dimensions to different (x, y) locations in a far field.

Target object 305 may reflect collimated light beam 342 by specular reflection or diffuse reflection. At least a portion of the reflected light 302 may reach second deflector 340 and may be deflected by second deflector 340 as a light beam 344 towards a third deflector 350. Third deflector 350 may deflect light beam 344 as a light beam 352 towards a receiver, which may include a lens 360 and a photodetector 370. Lens 360 may focus light beam 352 as a light beam 362 onto a location on photodetector 370, which may include a single photodetector or an array of photodetectors. Photodetector 370 may be any suitable high-speed detector that can detect light pulses in the working wavelength of the LiDAR system, such as a PIN photodiode, a silicon photomultiplier (SiPM) sensor, or an InGaAs avalanche photodetector. In some embodiments, one or more other deflectors may be used in the optical path to change the propagation direction of the light beam (e.g., fold the light beam) such that the size of optical subsystem 300 may be reduced or minimized without impacting the performance of the LiDAR system. For example, in some embodiments, a fourth deflector may be placed between third deflector 350 and lens 360, such that lens 360 and photodetector 370 may be placed in desired locations in optical subsystem 300.

The light deflectors described above may be implemented using, for example, a micro-mirror array, a galvo mirror, a stationary mirror, a grating, or the like. In one example implementation, first deflector 330 may include a micro-mirror array, second deflector 340 may include a galvo mirror, and third deflector 350 and other deflectors may include stationary mirrors. A micro-mirror array can have an array of micro-mirror assemblies, with each micro-mirror assembly having a movable micro-mirror and an actuator (or multiple actuators). The micro-mirrors and actuators can be formed as a microelectromechanical system (MEMS) on a semiconductor substrate, which may allow the integration of the MEMS with other circuitries (e.g., controller, interface circuits, etc.) on the semiconductor substrate.

The optical components in a LiDAR system, such as the light deflectors described above, may need to be installed on or held by mechanical structures such that the optical components can be securely placed in desired locations and aligned with each other. The mechanical structures may need to be small to fit in the optical subsystem and may need to be configured such that they may not obstruct the light path. A light steering system implemented using light deflectors, such as MEMS or other mirrors, and other optical components may be sensitive to alignment errors caused by, for example, manufacturing tolerance of the optical components and the mechanical structures, assemble tolerance, or even the unevenness in the thickness of the glue used to install the optical components on the mechanical structures. The combination of the alignment errors of the optical components may cause a large degradation of the performance (e.g., accuracy) of the overall LiDAR system. Thus, the mechanical structures may need to have multiple degrees of freedom, such as translations in x, y, and z directions and rotations around x axis (pitch), around y axis (roll), and around z axis (yaw), such that the mechanical structures may be adjusted to fine tune the position of the optical components mounted on the mechanical structures.

Figure 4:
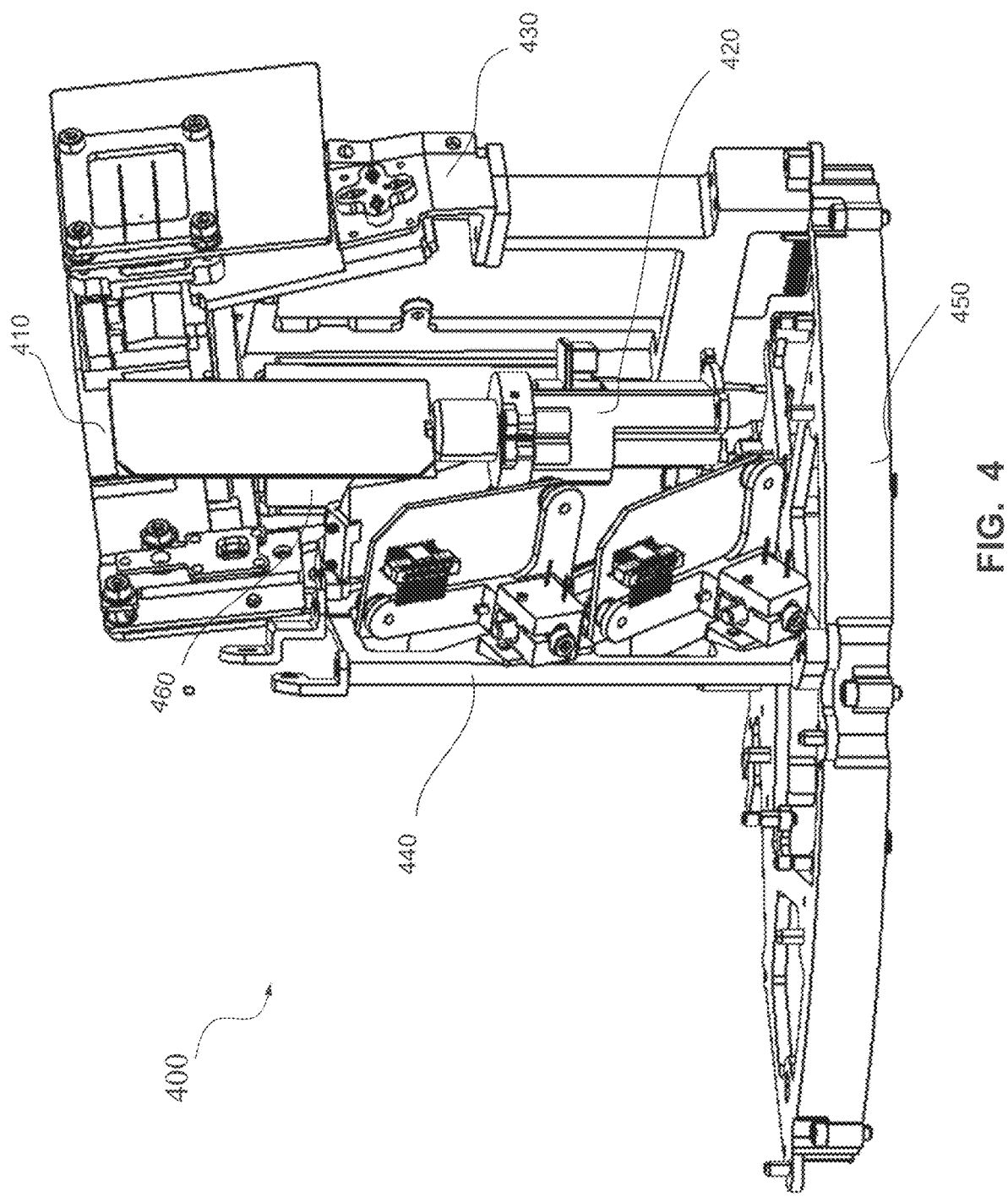
FIG. 4 is a perspective view of an example of a LiDAR system according to certain embodiments.

FIG. 4 is a perspective view of an example of a LiDAR system 400 according to certain embodiments. FIG. 4 illustrates various mechanical structures for installing optical components in the optical subsystem described above with respect to, for example, FIG. 3. For example, LiDAR system 400 may include a first unit 410 for mounting optical components, such as light source 310, collimation lens 320, and first deflector 330 (e.g., a MEMS mirror array). In the example shown in FIG. 4, first unit 410 may include an extending arm and a MEMS mount adjustably connected to the extending arm, where light source 310 and collimation lens 320 may be installed on the extending arm to form a coaxial subsystem, while first deflector 330 may be mounted on the MEMS mount. Thus, the position of first deflector 330 with respect to light source 310 and collimation lens 320 may be fine-tuned by adjusting the MEMS mount. In many cases, the MEMS mount may need to be adjusted with multiple degrees of freedom, including translations and rotations.

LiDAR system 400 may also include a second unit 420 for mounting second deflector 340 (e.g., a galvo mirror), which may be controlled to rotate, thus directing the light reflected from first deflector away from LiDAR system 400 and toward target object 305, as described above. Light deflected by first deflector 330 may be incident on second deflector 340 at different vertical locations, and second deflector 340 may have a rectangular shape that is elongated in the vertical direction to receive the deflected light. As also described above with respect to FIG. 3, in some embodiments, second deflector 340 may also be used to direct returned light reflected by target object 305 to third deflector 350 for sending to lens 360 and photodetector 370. In some embodiments, second deflector 340 may include a mirror assembly, where at least a portion of the mirror assembly may be used to direct the scanning light beam and at least a portion of the mirror assembly may be used to direct the returned light beam. Because of the elongated shape of second deflector 340 and the ability to rotate according to control signals, second unit 420 may only need to be adjusted to tune the angle of second deflector 340 with respect to the vertical direction.

Third deflector 350 may be mounted on a third unit 430, which may be adjacent to the MEMS mount in first unit 410. Third deflector 350 may deflect the returned light beam from second deflector 340 to lens 360 and photodetector 370, which may both be installed on a fourth unit 440 that includes multiple mounts for mounting one or more lenses 360 and one or more photodetectors 370. The positions of third deflector 350, lens 360, and photodetector 370 may also need to be tuned to align with each other and second deflector 340.

First unit 410, second unit 420, third unit 430, and fourth unit 440 may be secured on a chassis 450. Additional support and securing structures may be provided in addition to units 410, 420, 430, and 440. For example, in some embodiments, the returned light deflected by third deflector 350 may be further folded by a fourth deflector 460 before the returned light reaches lens 360. More details of these units may be described below. It is noted that the structure shown in FIG. 4 and described above and below is for illustration purposes only, and is not intended to be limiting. In light of the teaching of the present disclosure, those skilled in the art may contemplate other structures for the LiDAR system. For example, the units described above may be arranged differently and may include components or structures different from those described herein, and other units may be included in other embodiments.

As described above and below, the alignment and positions of the optical components in the LiDAR system may significantly impact the accuracy and other performance of the LiDAR system. Misalignment may be caused by various reasons, such as manufacturing tolerance, assembly tolerance, distortion of the components, and the like. Thus, it may be desirable that the mechanical structures for mounting the optical components can be adjusted to align or re-align these components at least during the assembly and maintenance. However, as shown by FIG. 4, LiDAR system 400 may include many optical components, mechanical structures, and electrical devices in a compact configuration, where light may be folded multiple times to reduce the physical dimension of the overall system and the mechanical structures may not obstruct the transmitted or received light. Due to the dimensional constraint, it may be challenging to include mechanical structures that have small sizes while providing the desired degrees of freedom for tuning as many stages with multiple degrees of freedom are usually bulky. Techniques disclosed herein, such as the mechanical designs described in details below, can be used to implement compact mechanical structures that can be adjusted with the desired degrees of freedom for tuning the position of the optical components.

II. MEMS Mount

Figure 5A:
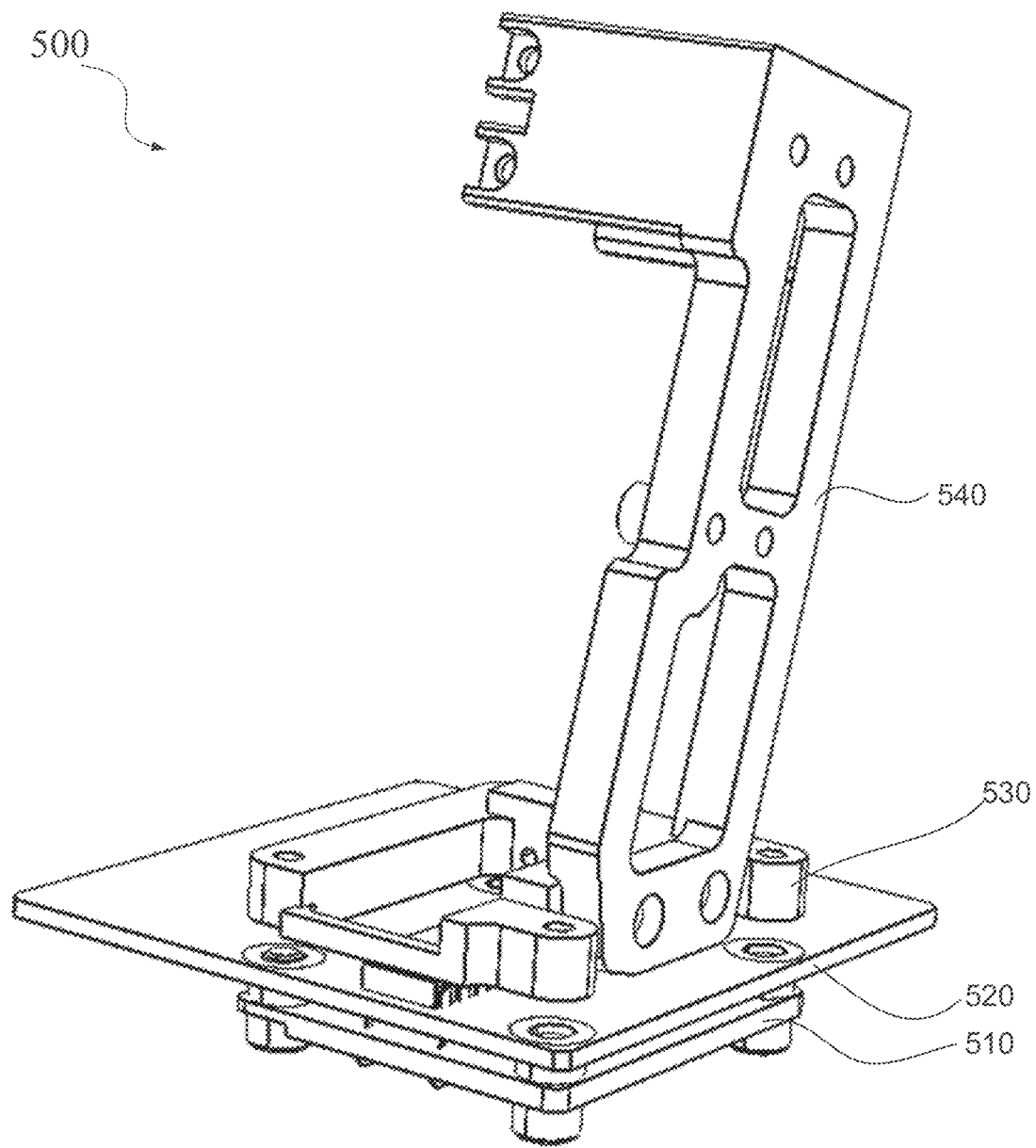
FIG. 5A illustrates an example of a kinematic mount for a MEMS device in a LiDAR system according to certain embodiments.
Figure 5B:
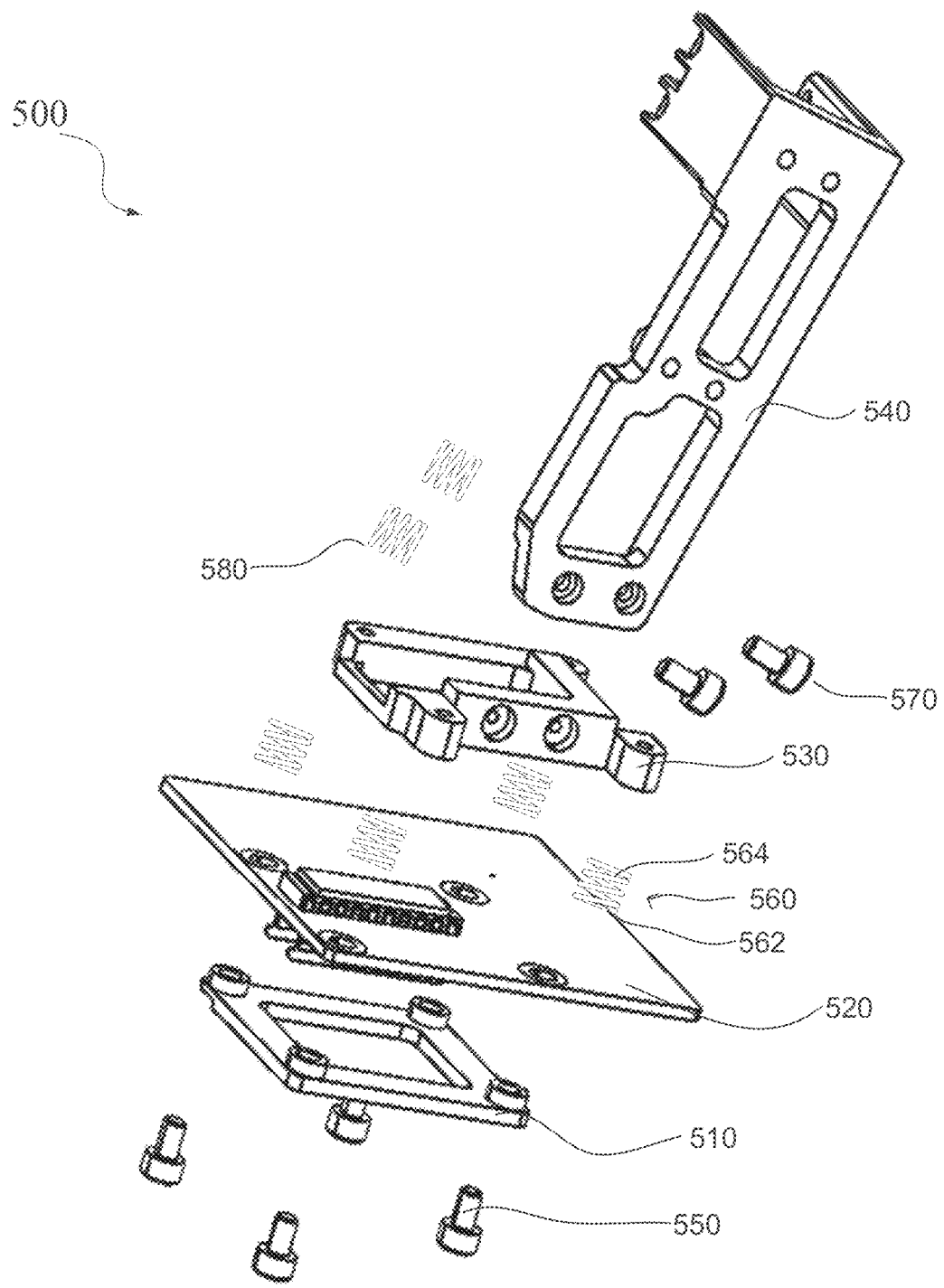
FIG. 5B is an exploded view of an example of a kinematic mount for a MEMS device in a LiDAR system according to certain embodiments.

FIG. 5A illustrates an example of a kinematic mount 500 for a MEMS device in a LiDAR system according to certain embodiments. FIG. 5B is an exploded view of kinematic mount 500. Kinematic mount 500 may be an example of first unit 410 shown in FIG. 4. Kinematic mount 500 shown in FIG. 5A is in the assembled state, and may include a bracket 510, a MEMS board 520, a mount 530, and an extending arm 540. When assembled, a plurality of connectors 550 may connect bracket 510, MEMS board 520, and mount 530, details of which are described below. A plurality of connectors 570 may be used to connect mount 530 and extending arm 540, details of which are described below.

In some embodiments, each connector 550 may include a screw, which may be inserted into corresponding bores formed in bracket 510 and MEMS board 520, and a threaded hole formed in mount 530 to connect bracket 510, MEMS board 520, and mount 530 together. In the assembled state, MEMS board 520 may be interposed between bracket 510 and mount 530. In some embodiments, MEMS board 520 may be configured to install thereon MEMS (including micro-mirror arrays) and semiconductor integrated circuits (not shown). An elastic member 560 (e.g., a wave spring) may be sleeved on each connector 550 and disposed between MEMS board 520 and mount 530 after kinematic mount 500 is assembled. The number of elastic members 560 may be equal to that of connectors 550, such as three or more. Each elastic member 560 may include a first end 562 and a second end 564. Elastic member 560 positioned between MEMS board 520 and mount 530 may push against MEMS board 520 with first end 562, and push against mount 530 with second end 564. The length of elastic member 560 from first end 562 to second end 564 may be adjusted by turning connector 550 into or out of the threaded hole in mount 530, thereby adjusting the position of MEMS board 520 with respect to mount 530 that is in turn connected to extending arm 540, which may be fixed with respect to, for example, chassis 450.

Similarly, each connector 570 may include a screw, which may be inserted into a bore formed in extending arm 540 and a threaded hole formed in mount 530 to connect extending arm 540 and mount 530 together. An elastic member 580 (e.g., a wave spring) may be sleeved on each connector 570 and disposed between extending arm 540 and mount 530 after kinematic mount 500 is assembled. The number of elastic members 580 may be equal to that of connectors 570, such as two or more. Each elastic member 580 may include a first end pushing against mount 530 and a second end pushing against extending arm 540. The length of elastic member 580 from the first end to the second end may be adjusted by turning connector 570 into or out of the threaded hole in mount 530, thereby adjusting the position of mount 530 (and thus MEMS board 520) with respect to extending arm 540. More details of these components and units are described below.

Figure 6:
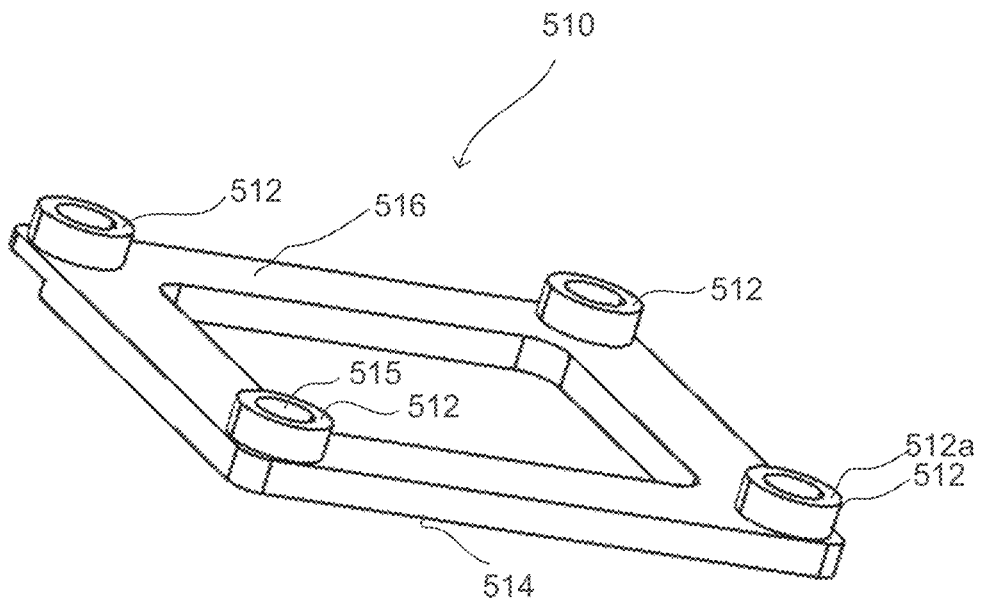
FIG. 6 shows an example of a bracket according to certain embodiments.

FIG. 6 illustrates an example of bracket 510 according to certain embodiments. Bracket 510 may have a substantially rectangular frame shape. In some embodiments, bracket 510 may provide accommodation space for devices mounted on MEMS board 520, such as certain electrical circuits for driving the MEMS device. MEMS board 520 can be thin and fragile. Bracket 510 may strengthen MEMS board 520 and prevent MEMS board 520 from bending, warping, or wearing. In some embodiments, bracket 510 may not be used when MEMS board 520 has sufficient strength. Those skilled in the art should understand that the shape of bracket 510 is not limited to rectangular. Other shapes can be used, such as a triangle, circle, hexagon, and the like.

In the example shown in FIG. 6, bracket 510 has a first side 514 and a second side 516 opposite to first side 514. When assembled, second side 516 of bracket 510 may face MEMS board 520. In other words, second side 516 is closer to MEMS board 520 than first side 514. In some embodiments, bracket 510 may include studs 512 on second side 516. Studs 512 may be perpendicular to second side 516 and may have a height determined according to specific application scenarios. The number of studs 512 may be equal to that of connectors 550, such as three or more. Each stud 512 has a first surface 512a. In some embodiments, when assembled, first surface 512a of stud 512 may be positioned to push against MEMS board 520. In some embodiments, stud 512 may be a separate element from bracket 510. In some embodiments, bracket 510 may alternatively or additionally include ancillary elastic members (not shown in FIG. 6). The ancillary elastic members may be similar to elastic member 560 shown in FIG. 5. When assembled, each ancillary elastic member may be sleeved on a connector 550 and may be disposed between bracket 510 and MEMS board 520. For example, the ancillary elastic member may push against first surface 512a of stud 512 (or second side 516 of bracket 510) with one end, and push against MEMS board 520 with the other end. As shown in FIG. 6, a bore 515 may extend through stud 512 to provide the passage for connector 550 to connect bracket 510 and MEMS board 520. In some embodiments, a diameter of bore 515 may be larger than that of connector 550 to facilitate assembly and adjustment. In some embodiments, studs 512 and/or the ancillary elastic members may not be used.

Figure 7:
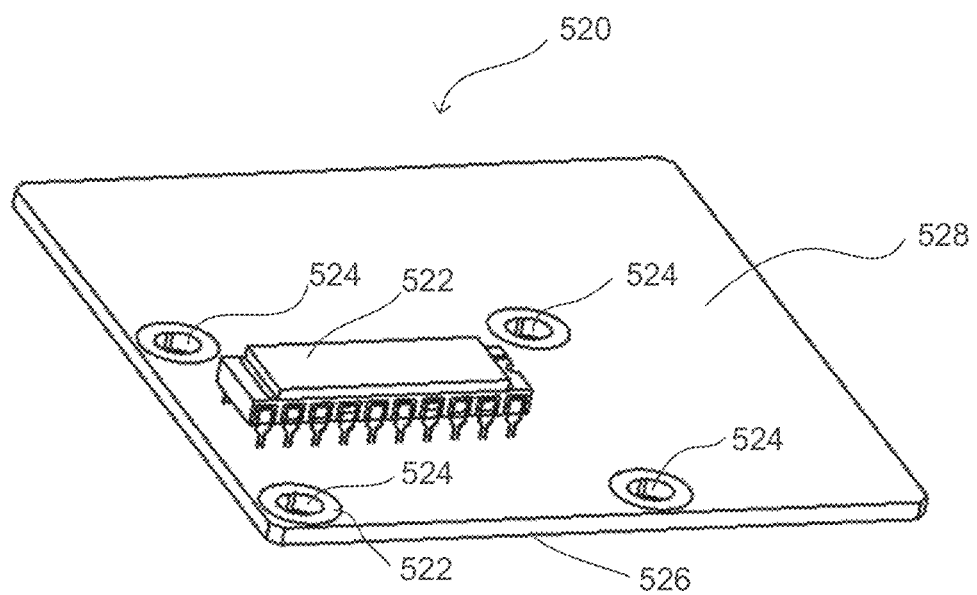
FIG. 7 shows an example of a MEMS board according to certain embodiments.

FIG. 7 illustrates an example of MEMS board 520 according to certain embodiments. MEMS board 520 may have a rectangular shape or any other suitable shape, such as a triangle, circle, hexagon, and the like. MEMS board 520 may have a first surface 526 and a second surface 528 opposite to first surface 526. MEMS board 520 may include MEMS device 522 mounted on second surface 528. MEMS board 520 may have bores 524 formed therein, which may be aligned with bores 515 in bracket 510 when assembled. The number of bores 524 may be equal to the number of connectors 550, such as three or more. As shown in FIG. 5A, each connector 550 may extend through the corresponding bore 524 when assembled.

Figure 8:
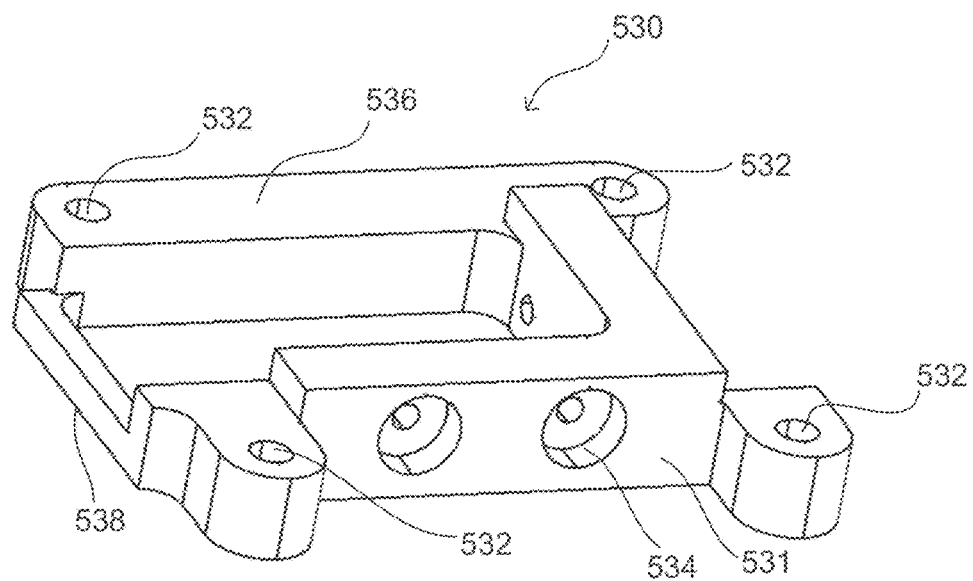
FIG. 8 shows an example of a kinematic mount according to certain embodiments.

FIG. 8 illustrates an example of mount 530 according to certain embodiments. Mount 530 may have a substantially rectangular shape or any other suitable shape, with the center portion being removed to allow light to reach MEMS device 522 and to provide accommodation space for MEMS device 522 or other components on MEMS board 520 when assembled. As shown in FIG. 8, mount 530 may have a certain thickness such that bores or threaded holes may be formed in mount 530, while mount 530 can still have the desired mechanical strength. Mount 530 may have a first surface 536 and a second surface 538 opposite to the first surface 536. Mount 530 may include bores 532 extending in a direction perpendicular to first surface 536 or second surface 538 of mount 530. The number of bores 532 may be equal to that of connectors 550, such as three or more. In some embodiments, bores 532 may be through holes to receive connectors 550 as shown in FIG. 5A. In some embodiments, each bore 532 may be a blind hole having an opening only on second surface 538 of mount 530. In some embodiments, each bore 532 may include two sections, where one section may be larger and unthreaded to form a receptacle for elastic member 560, while the second section may have a smaller diameter and may be threaded to receive connector 550 (e.g., a screw) and hold connector 550 in place. When assembled, each elastic member 560 as shown in FIGS. 5A and 5B may be disposed between MEMS board 520 and mount 530 (e.g., partially within the receptacle), and may push against mount 530 with one end and push against MEMS board 520 with the other end.

As shown in FIG. 8, mount 530 may have a first side 531 perpendicular to first surface 536 and/or second surface 538 of mount 530. Mount 530 may include bores 534 on first side 531 and extended in a direction perpendicular to first side 531 of mount 530. As illustrated in the example, each bore 534 may include two sections, where one section may be larger and unthreaded to form a receptacle for elastic member 580, while the second section may have a smaller diameter and may be threaded to receive connector 570 and hold connector 570 in place. The number of bores 534 may be equal to that of connectors 570, such as two or more.

Figure 9:
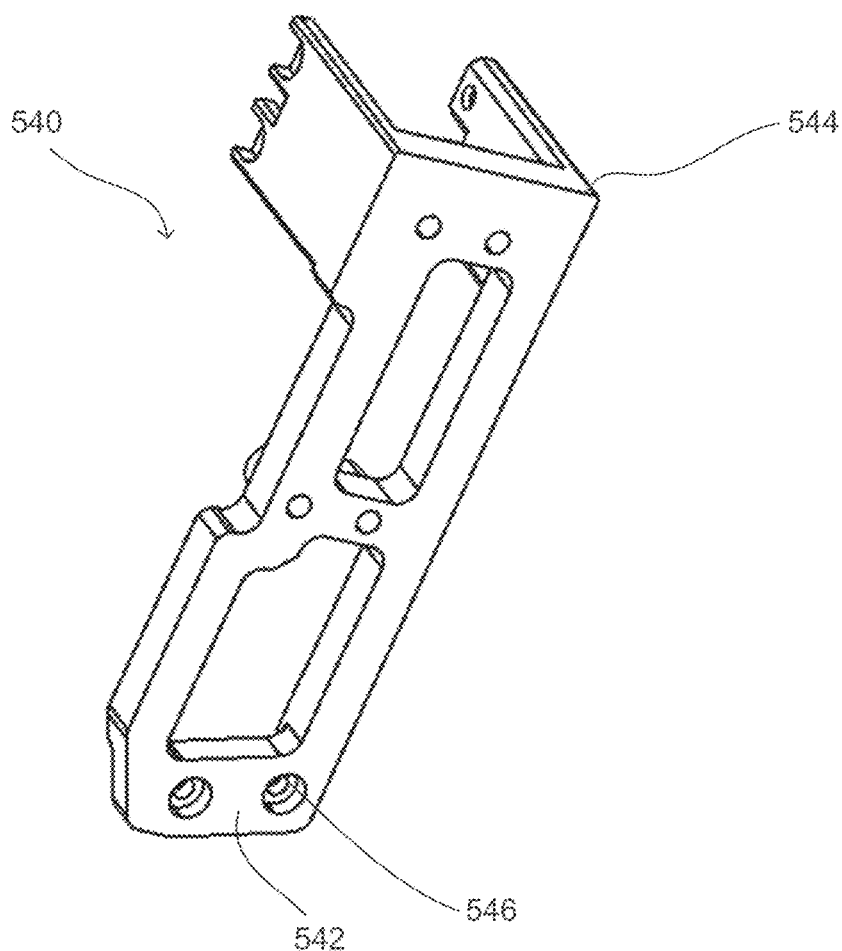
FIG. 9 illustrates an example of an extending arm according to certain embodiments.

FIG. 9 illustrates an example of extending arm 540 according to certain embodiments. Extending arm 540 may have an elongated shape, and may have a first end 542 proximate to the mount 530 when assembled, and a second end 544 opposite to first end 542. As illustrated, extending arm 540 may include two or more bores 546 extending in a direction perpendicular to the elongated surface of extending arm 540. The number of bores 546 may be equal to the number of connectors 570, such as two or more. As shown in FIGS. 5A and 5B, a connector 570 may pass through a bore 546 in extending arm 540 and may be inserted into a bore 534 in mount 530 to connect extending arm 540 to mount 530. An elastic member 580 may be sleeved on connector 570 and may be disposed between mount 530 and first end 542 of extending arm 540 (e.g., partially with the receptacle of bore 534). Elastic member 580 may push against mount 530 with the first end, and push against extending arm 540 with the second end. Turning connector 570 (e.g., a screw) may compress or relax elastic member 580, thereby adjusting the position of mount 530 (and thus MEMS board 520) with respect to extending arm 540.

Kinematic mount 500 described above may provide at least five degrees of freedom for adjusting MEMS board 520 with respect to extending arm 540, which may be fixed to chassis 450 described above. As described above, optical components such as light source 310 and collimation lens 320 may be installed on second end 544 of extending arm 540. Thus, aligning MEMS board 520 may align MEMS device 522 (e.g., first deflector 330) with light source 310 and collimation lens 320 installed on extending arm 540.

Figure 10:
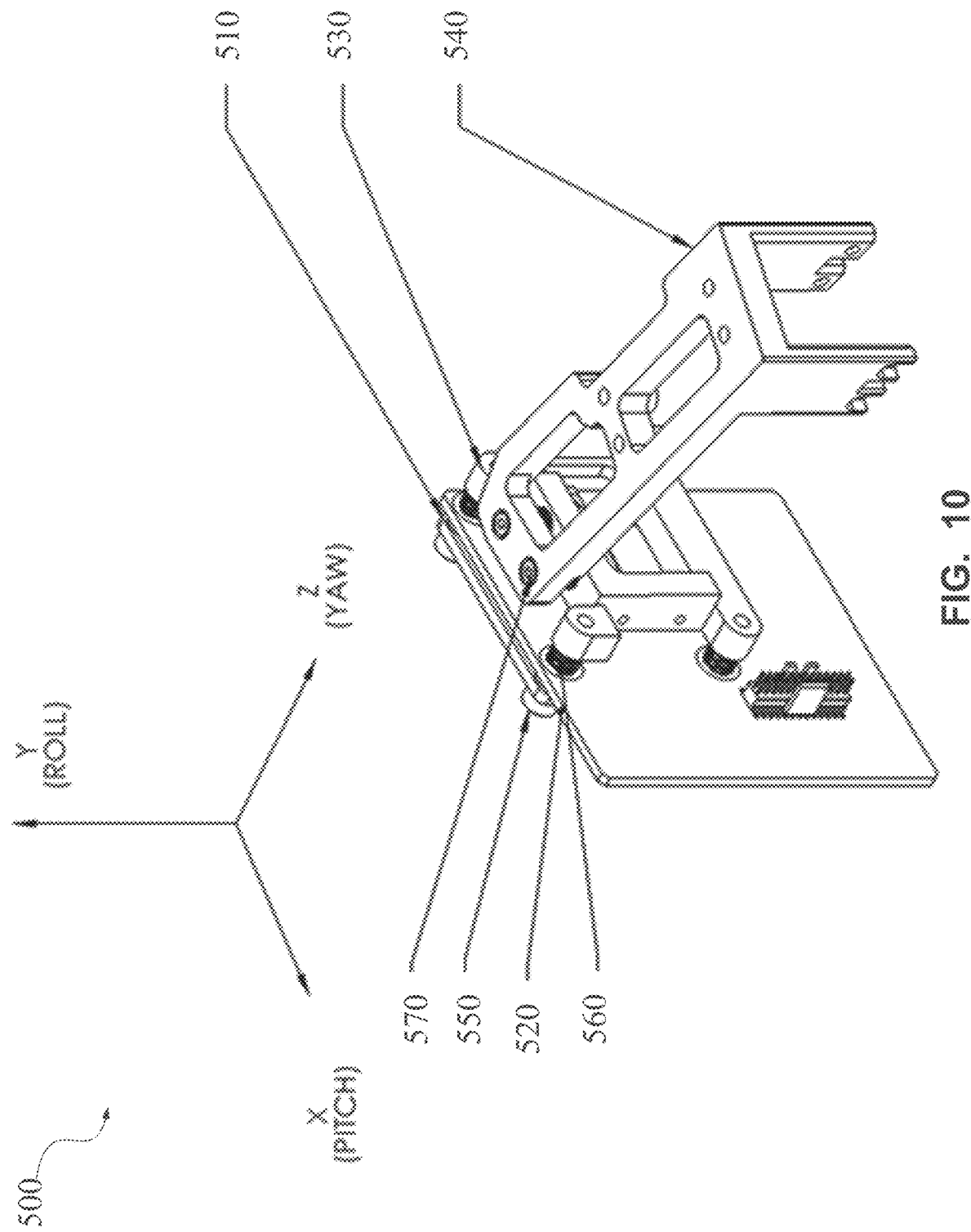
FIG. 10 shows an example of a kinematic mount in the assembled state according to certain embodiments.

FIG. 10 illustrates an example of kinematic mount 500 in the assembled state according to certain embodiments. For convenience of showing movement of MEMS board 520 with respect to extending arm 540, a Descartes coordinate system is shown in FIG. 10, where first surface 526 or second surface 528 of MEMS board 520 may be in the x-y plane and the direction perpendicular to first surface 526 or second surface 528 of MEMS board 520 may be the z direction. Thus, the elongated surface of extending arm 540 may be in the x-z plane. In some embodiments, kinematic mount 500 can allow translations of MEMS board 520 in the y direction and the z direction with respect to extending arm 540. Kinematic mount 500 may also facilitate rotations of MEMS board 520 around x, y and z axes with respect to extending arm 540. For convenience of illustration and description, the rotation angle around x axis may be referred to as the pitch angle, the rotation angle around the y axis may be referred to as the roll angle, and the rotation angle around the z axis may be referred to as the yaw angle. Details of the translations and rotations of MEMS board 520 are described below.

Figure 11:
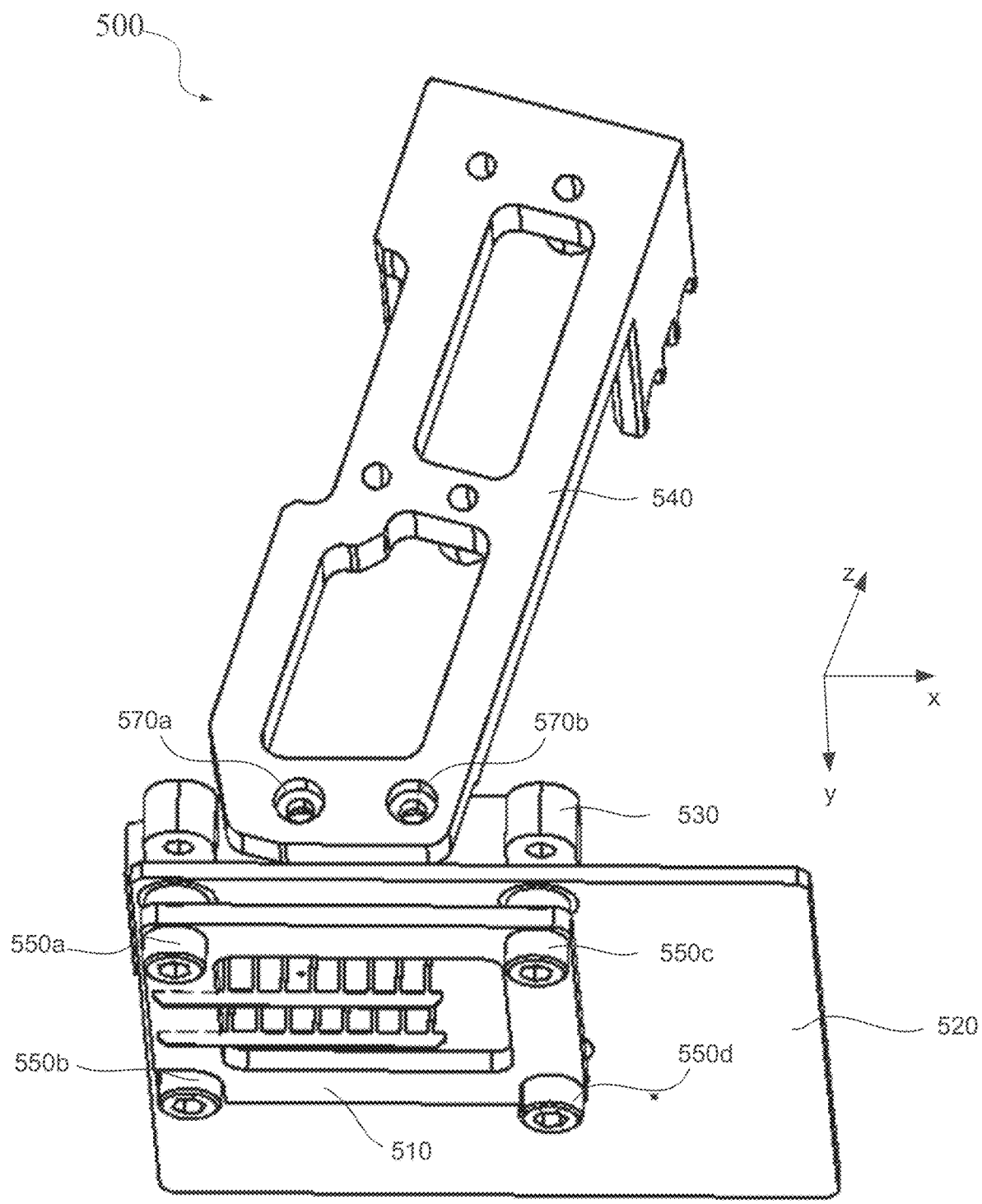
FIG. 11 is a perspective view of a kinematic mount for illustrating the movement of a MEMS board with respect to an extending arm.

FIG. 11 is another perspective view of kinematic mount 500 for illustrating the movement of MEMS board 520 with respect to extending arm 540. In the example illustrated in FIG. 11, the position of MEMS board 520 may be tuned by adjusting connectors 550a, 550b, 550c, 550d, 570a, and 570b. For example, when all four connectors 550a, 550b, 550c, and 550d are driven in a first direction, MEMS board 520 may move along z axis toward the mount 530. In some embodiments, the first direction may be the clockwise direction. When all four connectors 550a, 550b, 550c, and 550d are driven in a second direction opposite to the first direction, MEMS board 520 may move in −z direction away from mount 530. In some embodiments, the second direction may be the counterclockwise direction. It is noted that, in some embodiments, three or more connectors 550 may be used to uniquely define a plane for MEMS board 520. Similarly, two or more connectors 570 may be used to adjust the yaw angle and the y position of MEMS board 520 with respect to extending arm 540.

Figure 12A:
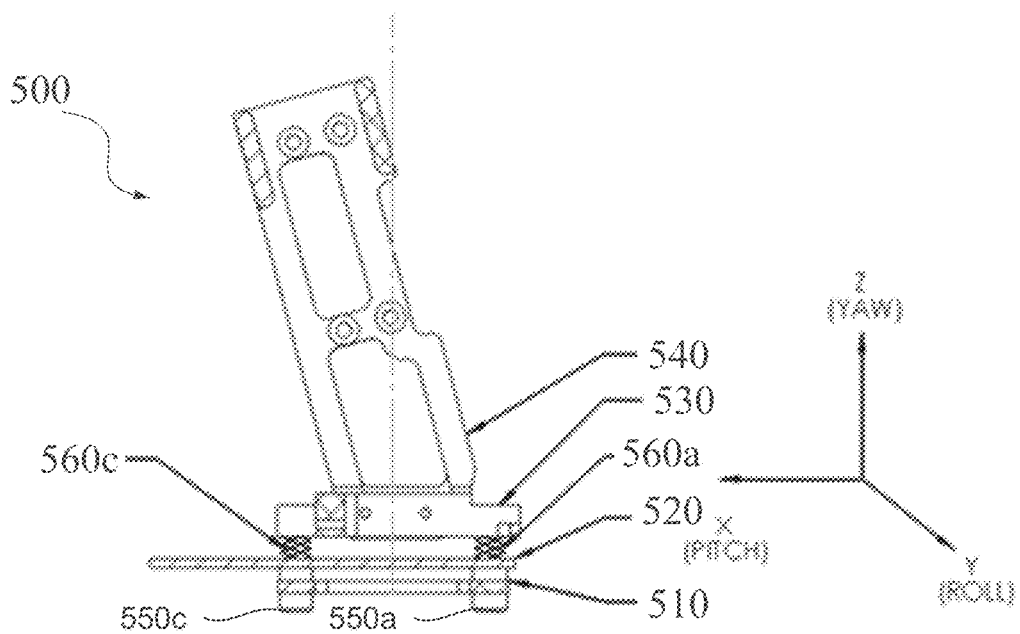
FIG. 12A is a cross-sectional view of a kinematic mount.
Figure 12B:
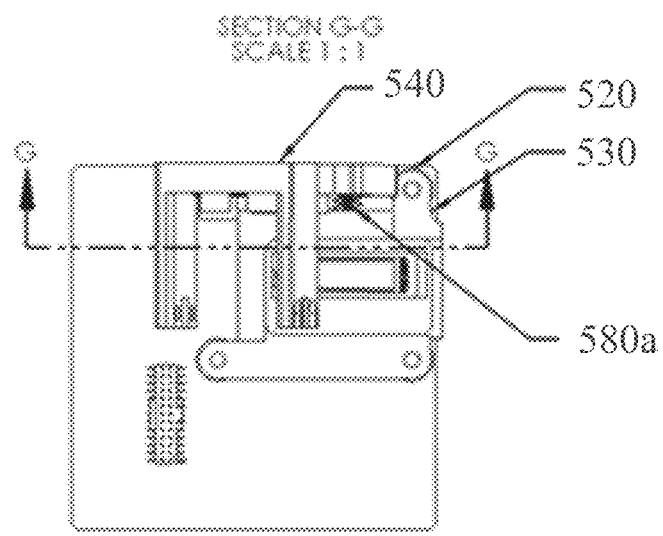
FIG. 12B is a top view of the kinematic mount shown in FIG. 12A.

FIGS. 12A and 12B illustrate the translations of MEMS board 520 (e.g., in the z directions) and the rotations of MEMS board 520, for example, with respect to the y axis (roll angle) according to some embodiments. FIG. 12A is a cross-sectional view of kinematic mount 500 along a line G-G in FIG. 12B. FIG. 12B is a top view of kinematic mount 500. As illustrated, when connectors 550a and 550c (and connectors 550b and 550d that are not shown in FIGS. 12A and 12B) are driven in the same direction, MEMS board 520 may move in the +z or −z direction. When connectors 550c and 550d are driven in a first direction while connectors 550a and 550b are not driven or are driven in an opposite direction, or when connectors 550a and 550b are driven in a first direction while connectors 550c and 550d are not driven or are driven in an opposite direction, MEMS board 520 may rotate around the y axis to change the roll angle of MEMS board 520.

Figure 12C:
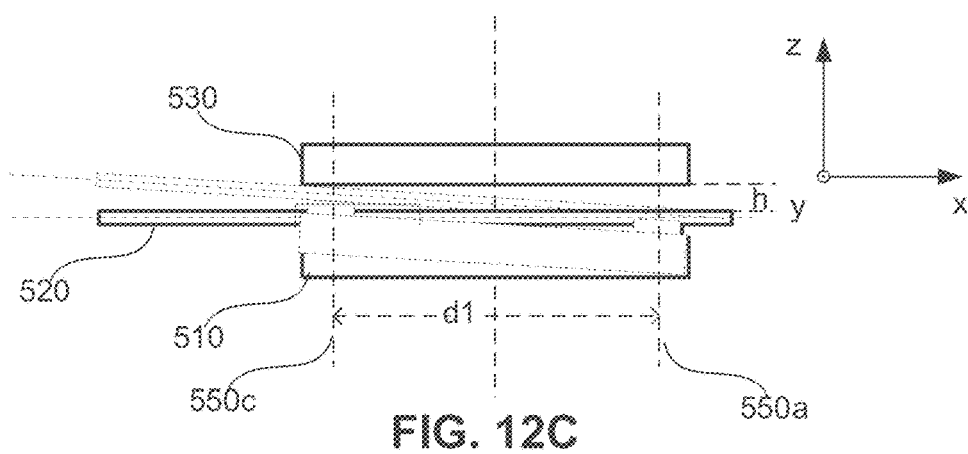
FIG. 12C illustrates the range of roll angle adjustment in the kinematic mount shown in FIG. 12A.

FIG. 12C illustrates the range of roll angle adjustment in kinematic mount 500. For convenience and clarity, FIG. 12C may not show all components of kinematic mount 500, and relevant components involved may have been simplified. As shown in FIG. 12C, bracket 510 may have a length d1 between the centers of connectors 550a and 550c. Connector 550c may be turned to apply the maximum compression force on elastic member 560c, while connector 550a may be turned to apply the minimum compression force on elastic member 560a. As such, MEMS board 520 may rotate around the y axis, and the difference between the maximum distance between MEMS board 520 and mount 530 and the minimum distance between MEMS board 520 and mount 530 may be about h as shown in FIG. 12C. Therefore, the maximum roll angle α around y axis may be determined by the following equation:

$$\alpha = \arctan\left(\frac{h}{d1}\right).$$

For example, if d1 is about 32 mm and h is about 2.5 mm, the maximum roll angle adjustment may be about +4.5°. In another example, connector 550a may be turned to apply the maximum compression force on elastic member 560a, while connector 550c may be turned to apply the minimum compression force on elastic member 560c, MEMS board 520 may rotate around y axis in an opposite direction. Therefore, the range of the roll angle adjustment may be between, for example, about −4.5° and about +4.5°.

In some other examples, a single connector 550a, 550b, 550c, or 550d may be driven, such that the distance between MEMS board 520 and mount 530 at the location of the single connector 550a, 550b, 550c, or 550d that is driven may be reduced or increased. In such cases, MEMS board 520 may rotate around both x axis and y axis to change the pitch angle and the roll angle at the same time. For example, as shown in FIG. 11, connector 550a can be driven such that the distance between MEMS board 520 and mount 530 at the position of connector 550a may be reduced, MEMS board 520 may pivot around connector 550d to change the pitch angle around x axis and the roll angle around y axis. Any one or more of connectors 550a, 550b, 550c, and 550d may be driven to achieve the desired orientation of MEMS board 520 with respect to extending arm 540.

Figures 13A, 13B:
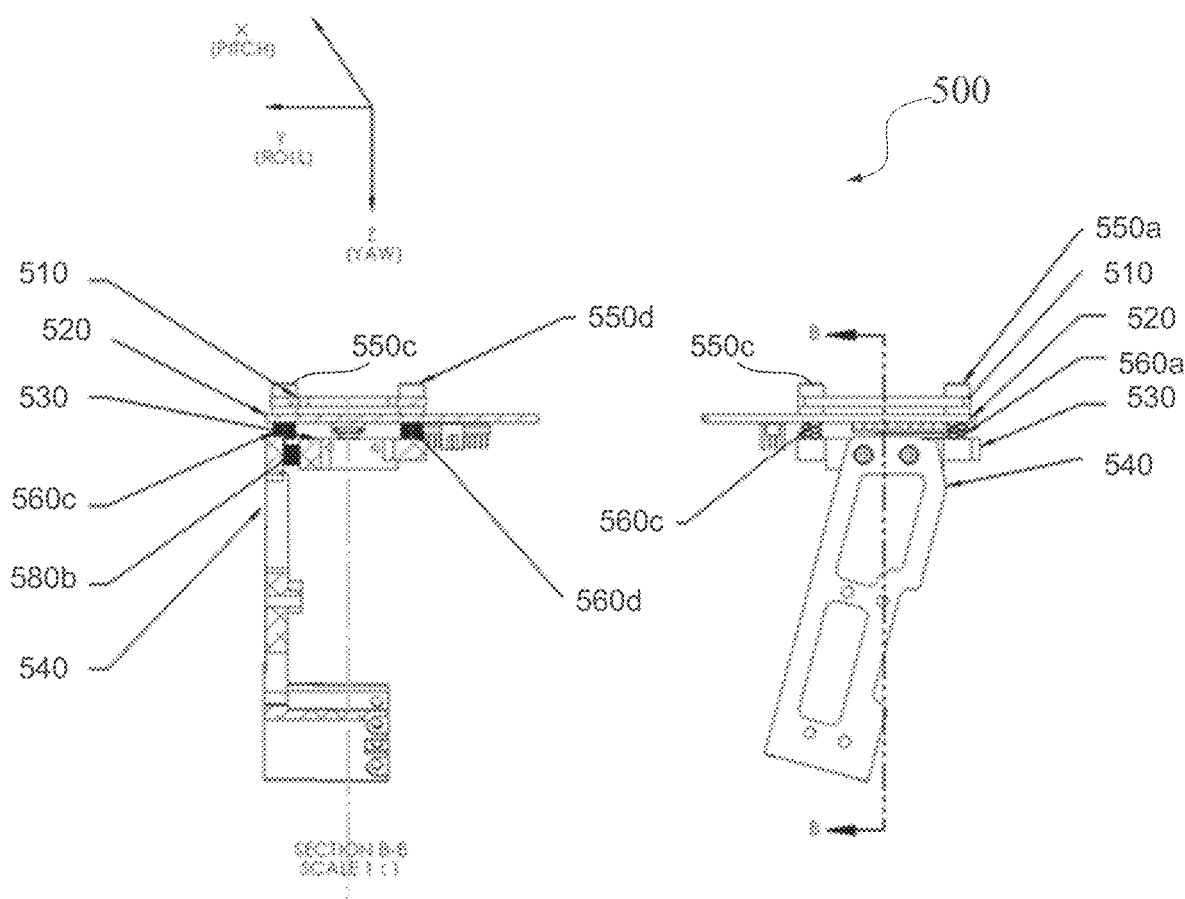
FIG. 13A is a cross-sectional view of a kinematic mount.
FIG. 13B is a side view of the kinematic mount shown in FIG. 13A.

FIGS. 13A and 13B illustrate the translations of MEMS board 520 (e.g., in the z direction) and the rotations of MEMS board 520, for example, with respect to the x axis (pitch angle) according to some embodiments. FIG. 13A is a cross-sectional view of kinematic mount 500 along a line B-B in FIG. 13B. FIG. 13B is a side view of kinematic mount 500. As illustrated, when connectors 550c and 550d and connectors 550a and 550b (which are not shown in FIG. 13A) are driven in the same direction, MEMS board 520 may move in the +z or −z direction. When connectors 550c and 550a are driven in a first direction while connectors 550d and 550b are not driven or are driven in an opposite direction, or when connectors 550d and 550b are driven in a first direction while connectors 550c and 550a are not driven or are driven in an opposite direction, MEMS board 520 may rotate around the x axis to change the pitch angle of MEMS board 520.

Figure 13C:
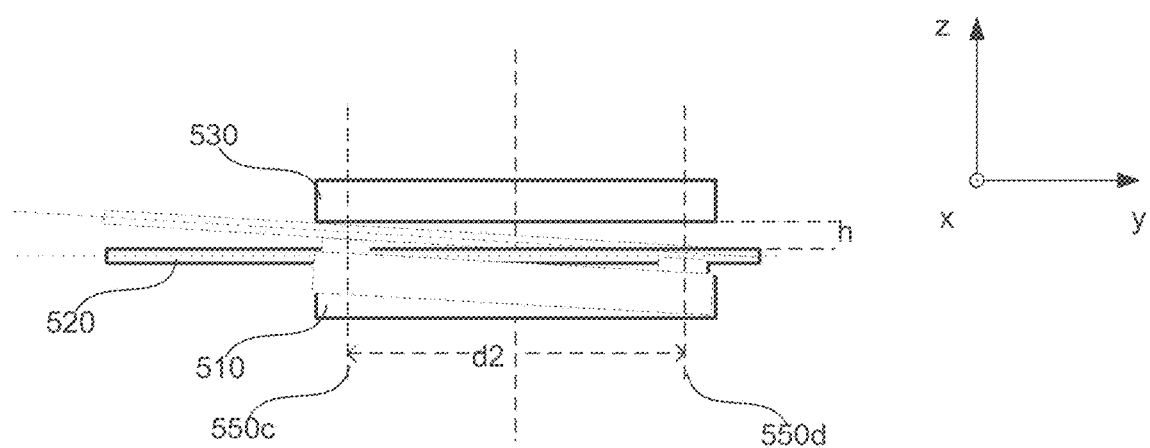
FIG. 13C illustrates the range of pitch angle adjustment in the kinematic mount shown in FIG. 13A.

FIG. 13C illustrates the range of pitch angle adjustment in kinematic mount 500. For convenience and clarity, FIG. 13C may not show all components of kinematic mount 500, and relevant components involved may have been simplified. As shown in FIG. 13C, bracket 510 may have a length d2 between the centers of connectors 550c and 550d. Connector 550c may be turned to apply the maximum compression force on elastic member 560c, while connector 550d may be turned to apply the minimum compression force on elastic member 560d. As such, MEMS board 520 may rotate around the x axis, and the difference between the maximum distance between MEMS board 520 and mount 530 and the minimum distance between MEMS board 520 and mount 530 may be about h as shown in FIG. 13C. Therefore, the maximum pitch angle θ around x axis may be determined by the following equation:

$$\beta = \arctan\left(\frac{h}{d2}\right).$$

For example, if d2 is about 28 mm and h is about 2.5 mm, the maximum roll angle adjustment may be about +5.1°. In another example, connector 550d may be turned to apply the maximum compression force on elastic member 560d, while connector 550c may be turned to apply the minimum compression force on elastic member 560c, MEMS board 520 may rotate around x axis in an opposite direction. Therefore, the range of the pitch angle adjustment may be between, for example, about −5.1° and about +5.1°.

Figure 14:
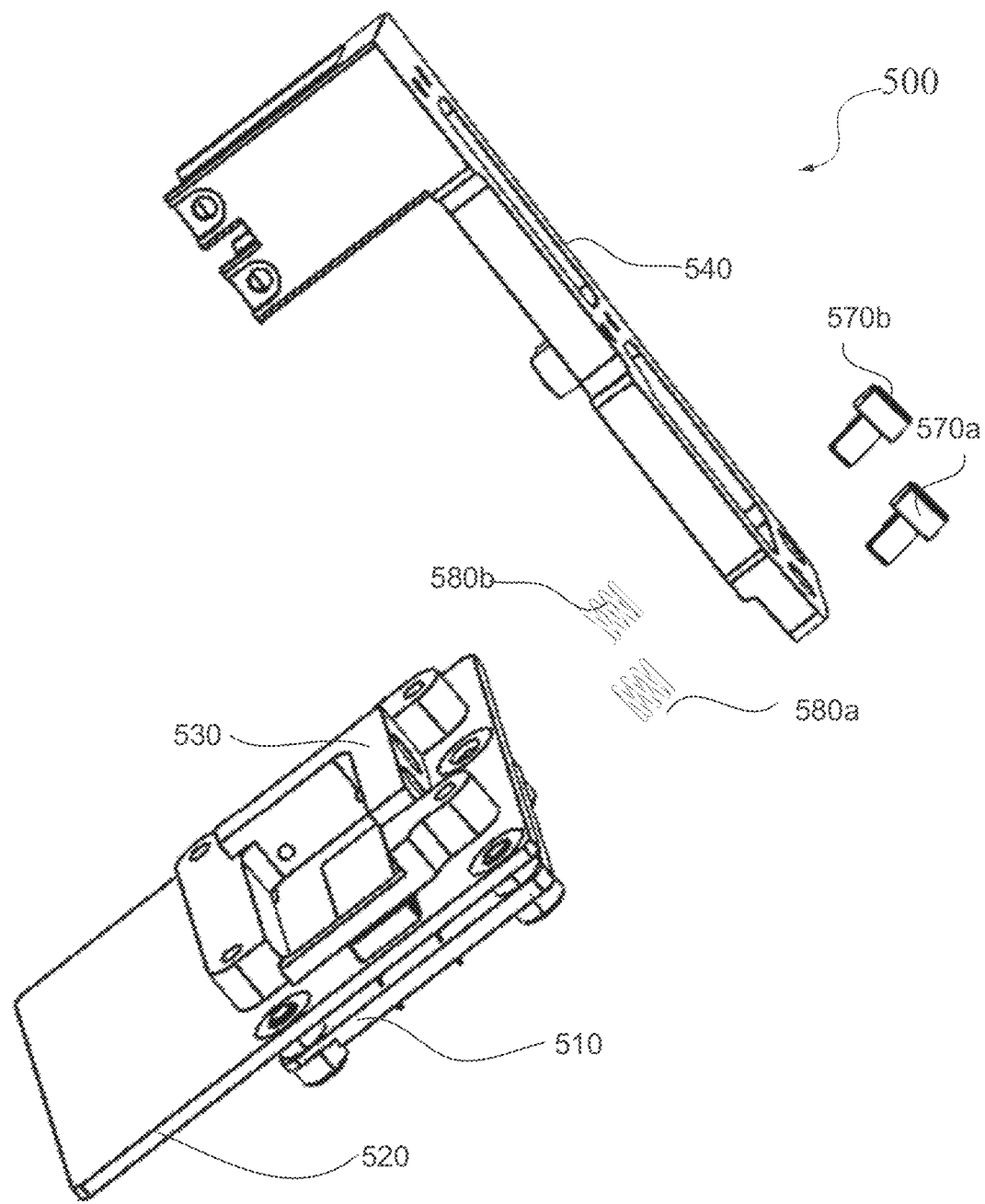
FIG. 14 is an exploded view of an example of a kinematic mount according to certain embodiments.

FIG. 14 is another exploded view of an example of kinematic mount 500 according to certain embodiments. FIG. 14 illustrates the connection between mount 530 and extending arm 540 using connectors 570a and 570b and elastic members 580a and 580b. Connectors 570a and 570b and elastic members 580a and 580b may be used to adjust the translation of MEMS board 520 in the y direction and the rotation of MEMS board 520 with respect to z axis (the yaw angle).

Figures 15A, 15B:
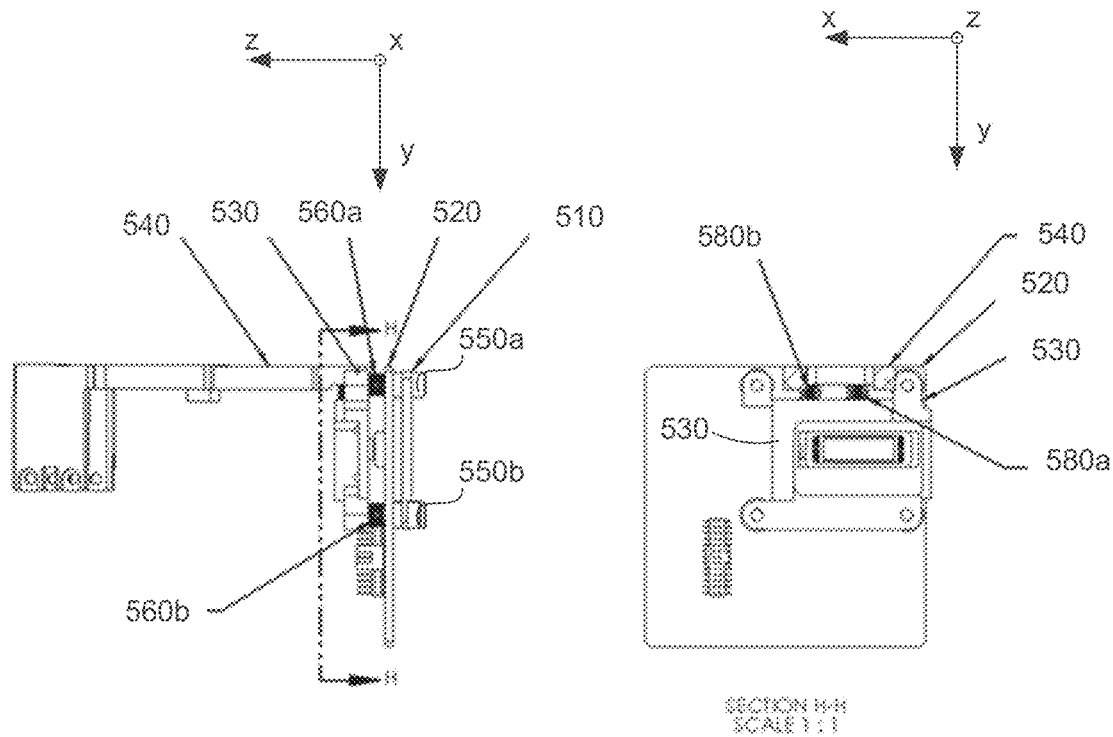
FIG. 15A is a side view of a kinematic mount according to certain embodiments.
FIG. 15B is a cross-sectional view of the kinematic mount shown in FIG. 15A.

FIGS. 15A and 15B illustrate the translations of MEMS board 520 (e.g., in the y and z directions) and the rotation of MEMS board 520, for example, with respect to the z axis (yaw angle) according to some embodiments. FIG. 15A is a side view of kinematic mount 500. FIG. 15B is a cross-sectional view of kinematic mount 500 along a line H-H in FIG. 15A. As illustrated in FIG. 15A and described above with respect to FIGS. 13A and 13B, when connectors 550a and 550b and connectors 550c and 550d (which are not shown in FIGS. 15A-15B) are driven in the same direction, MEMS board 520 may move in the +z or −z direction. When connectors 550a and 550c are driven in a first direction while connectors 550b and 550d are not driven or are driven in an opposite direction, or when connectors 550b and 550d are driven in a first direction while connectors 550a and 550c are not driven or are driven in an opposite direction, MEMS board 520 may rotate around the x axis to change the pitch angle of MEMS board 520.

As shown in FIG. 15B, when connectors 570a and 570b are driven in a same direction to compress or relax elastic members 580a and 580b, MEMS board 520 may move in the +y or −y direction with respect to extending arm 540. In addition, when connector 570a is driven in a first direction while connector 570b is not driven or is driven in an opposite direction, or when connector 570b is driven in a first direction while connector 570a is not driven or is driven in an opposite direction, MEMS board 520 may rotate around the z axis to change the yaw angle γ of MEMS board 520.

Figure 15C:
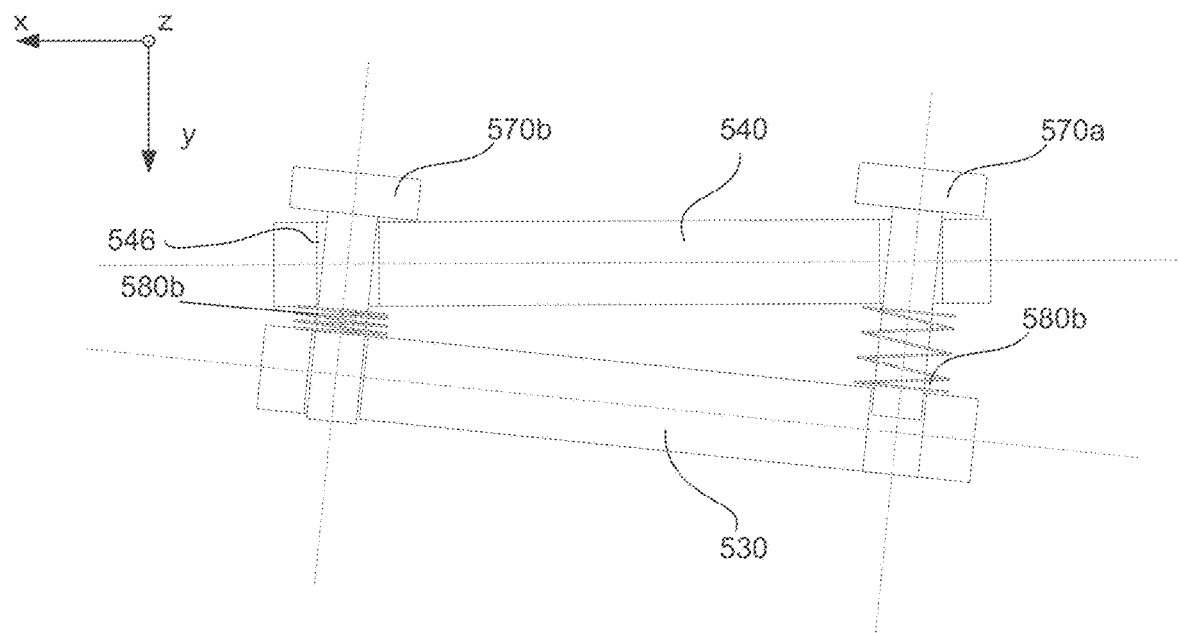
FIG. 15C illustrates the range of yaw angle adjustment in the kinematic mount shown in FIG. 15A.

FIG. 15C illustrates the range of yaw angle adjustment in kinematic mount 500. For convenience and clarity, FIG. 15C may not show all components of kinematic mount 500, and relevant components involved may have been simplified. As shown in FIG. 15C, connectors 570a and 570b may be driven separately or concurrently to change the yaw angle γ of mount 530 (and thus MEMS board 520) around the z axis. In the example shown in FIG. 15C, connector 570b may be turned to apply the maximum compression force on elastic member 580b and connector 570a may be turned to apply the minimum compression force on elastic member 580a to achieve the maximum yaw angle γ adjustment. The achievable maximum yaw angle γ adjustment may be determined based on the dimensions of bore 546 in extending arm 540, the thickness of extending arm 540, and the diameter of connector 570a or 570b. In some embodiments, the yaw angle γ adjustment can be in the range of, for example, about −15° to about 15°. In one example, the diameter of bore 546 is about 2.4 mm, the diameter of connector 570a is about 2.0 mm, and the thickness of extending arm 540 is about 1.8 mm, and thus the maximum yaw angle γ adjustment between extending arm 540 and mount 530 is about 11.32°. In various embodiments, the maximum yaw angle γ adjustment may be changed by changing one or more of the dimensions of bore 546 in extending arm 540, the thickness of extending arm 540, and the diameter of connector 570a or 570b.

III. Galvo Mirror Assembly

Figure 18:
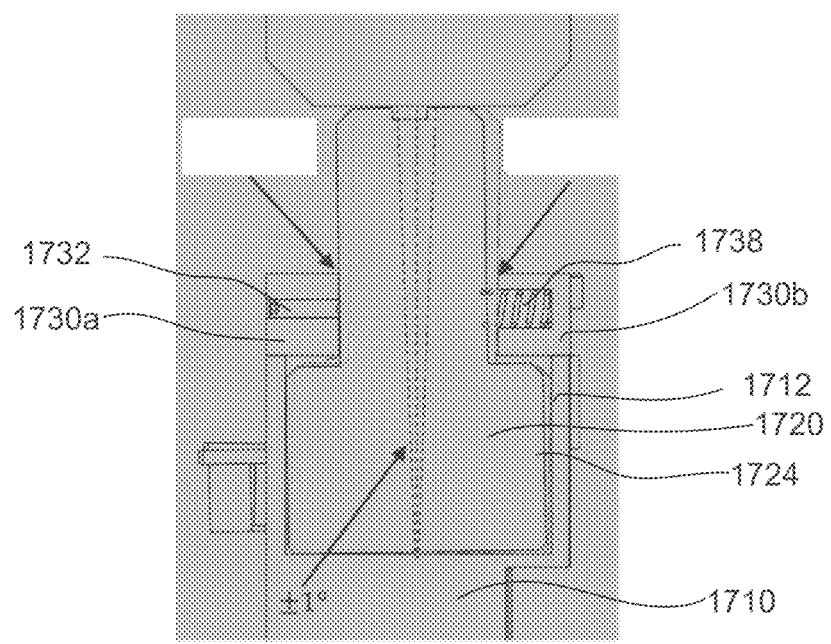
FIG. 18 shows another perspective view of the mirror assembly shown in FIG. 16.

FIGS. 16-18 illustrate an example of second unit 420. FIG. 16 illustrates a perspective view of second unit 420 according to certain embodiments. As shown in FIG. 16, second unit 420 includes a bottom holder 1710, a mirror holder 1720 and a mirror mounted on the mirror holder 1720 (e.g., second deflector 340). Mirror holder 1720 is secured to bottom holder 1710 by caps 1730a-1730b.

FIG. 17 illustrates an example of second unit 420 in an exploded view. In the example shown in FIG. 17, second unit 420 includes bottom holder 1710, which has a receiving recess 1712 on a top portion of bottom holder 1710. Receiving recess 1712 has an opening 1714 on one side. Second unit 420 includes a mirror holder 1720. A mirror, such as second deflector 340 (e.g., a galvo mirror) is mounted on a top portion 1722 of mirror holder 1720. A bottom portion 1724 of mirror holder 1720 is received in receiving recess 1712 of bottom holder 1710. In some embodiments, bottom holder 1710 and mirror holder 1720 have a substantially cylinder shape. The diameter of receiving recess 1712 may be larger than that of bottom portion 1724. As such, mirror holder 1720 may be tilted with respect to bottom holder 1710 when assembled, to adjust the orientation of second deflector 340 on mirror holder 1720. In some embodiments, the diameter of top portion 1722 is less than that of bottom portion 1724 so as to form a shoulder 1726 at the interface between top portion 1722 and bottom portion 1724. It is noted that the shape of bottom holder 1710 and that of mirror holder 1720 are not limited to a cylinder shape.

Second unit 420 further includes a cap assembly including two caps 1730a and 1730b to secure mirror holder 1720 in receiving recess 1712 of bottom holder 1710. In some embodiments, caps 1730a and 1730b are approximately in the shape of a half cylinder. Caps 1730a and 1730b can be combined to form a substantially cylinder shape. At either side of cap 1730a, there is a bore 1733 formed through the thickness of cap 1730a. Cap 1730a has two bores 1733. An ear portion 1716 is formed on the top portion of bottom holder 1710 at either side of receiving recess 1712. A bore 1715 is formed in each ear portion 1716. When cap 1730a is assembled with bottom holder 1710, bore 1733 in cap 1730a is aligned with bore 1715 in ear portion 1716. Bolt 1739 can be inserted in bore 1733 and bore 1715 to secure cap 1730a to bottom holder 1710. In the assembled state, cap 1730a may press against shoulder 1726 of mirror holder 1720. In a similar way, cap 1730b can be secured to bottom holder 1710 and presses against shoulder 1726 of mirror holder 1720. In this way, mirror holder 1720 is secured to bottom holder 1710. In some embodiments, bolt 1739 can be replaced by a screw, and bore 1715 in ear portion 1716 may include threads to receive the screw. In some embodiments, an elastic member 1736a (e.g., a wave spring) may be disposed between a bottom surface of the cap 1730a and shoulder 1726 of mirror holder 1720. Similarly, an elastic member 1736b (e.g., a wave spring) may be disposed between a bottom surface of cap 1730b and shoulder 1726 of mirror holder 1720. Elastic members 1736a and 1736b may provide elastic force between the caps 1730a and 1730b and the shoulder 1726. In some embodiments, elastic members 1736a and 1736b may have sufficiently high elastic coefficients to prevent mirrors on mirror holder 1720 from swinging during operation of LiDAR system 102 (as shown in FIG. 1). It is noted that the elastic members are not limited to two elastic members 1736a and 1736b as shown in FIG. 17, and elastic members 1736a and 1736b are not limited to wave springs. For example, there may be two or more elastic members under each of caps 1730a and 1730b.

As shown in FIG. 17, cap 1730a includes two set screws 1732 that are disposed in corresponding holes 1737 formed along a radial direction of cap 1730a. In some embodiments, holes 1737 are formed symmetrically about a radial direction of the cap 1730a. For example, when cap 1730a is in a half cylinder shape as shown in FIG. 17, holes 1737 may be formed along radial directions of cap 1730a at the ⅛ circumference and ⅜ circumference of cap 1730a. Cap

1730b includes two blind holes 1738 that are formed along the radial direction of cap 1730b at the ⅛ circumference and ⅜ circumference of cap 1730b. Blind holes 1738 are opened toward the center of cap 1730b. When caps 1730a and 1730b are assembled, holes 1737 and holes 1738 are diametrically opposite to each other. An elastic member 1734 (e.g., a wave spring) is received in hole 1738. In the related state, elastic member 1734 is longer than the depth of hole 1738. In this way, elastic member 1734 may provide an elastic force against mirror holder 1720 when the caps 1730a and 1730b are assembled with mirror holder 1720.

FIG. 18 shows another perspective view of second unit 420. As shown more clearly in FIG. 18, set screw 1732 pushes against mirror holder 1720 along a radial direction when assembled. Elastic member 1734 applies an elastic force to mirror holder 1720 from an opposite radial direction. In some embodiments, elastic member 1734 may have a sufficiently large spring coefficient to prevent second deflector 340 (e.g., a galvo mirror) mounted on top portion 1722 of mirror holder 1720 from swinging when the LiDAR system is subject to a large acceleration (e.g., an acceleration of 1 g-2 g level) or deceleration. In some embodiments, the height of bottom portion 1724 of mirror holder 1720 is lower than the depth of receiving recess 1712 of bottom holder 1710. In this way, the space between bottom portion 1724 and receiving recess 1712 allows for the movement of mirror holder 1720 with respect to bottom holder 1710. For example, mirror holder 1720 may tilt within about ±1° with respect to bottom holder 1710. The extent of the tilting can be adjusted through set screws 1732. For example, when set screw 1732 is driven toward mirror holder 1720, the tilting angle of mirror holder 1720 is increased. On the contrary, when the set screw 1732 is driven away from mirror holder 1720, the tilting angle may be decreased. For a typical application, a tilting angle about ±1° may provide a compensation range of about ±3.5 meters at a detecting range of 200 meters. It should be noted that various ranges of tilting angle other than ±1° have been contemplated.

IV. Mirror Mount

FIG. 19 illustrates a perspective view of an example of third unit 430 according to certain embodiments. In the illustrated example, third unit 430 includes a mirror bracket 1910 and a bracket frame 1920. Mirror bracket 1910 includes a receiving groove 1912 for receiving a mirror, such as third deflector 350 as shown in FIG. 3. Mirror bracket 1910 is connected at the lower portion with the upper portion of bracket frame 1920. As shown in FIG. 19, four bores 1914a, 1914b, 1914c, and 1914d are formed through mirror bracket 1910.

FIG. 20 illustrates a perspective view of an example of third unit 430 according to certain embodiments. As shown in FIG. 20, four bores 1924a, 1924b, 1924c, and 1924d are formed through the upper portion of bracket frame 1920. When mirror bracket 1910 is assembled with bracket frame 1920, bores 1914a-1914d and bores 1924a-1924d are aligned with each other. In some embodiments, the upper portion of bracket frame 1920 is in a substantially rectangular shape with four corners. A bore 1928 is formed at each corner of the upper portion of bracket frame 1920. In some embodiments, bracket frame 1920 has a boss 1926 formed on a surface 1922 distant from mirror bracket 1910 when assembled. In some embodiments, a countersink is formed around each of the openings of bores 1924a-1924d on the surface of boss 1926.

Figure 21:
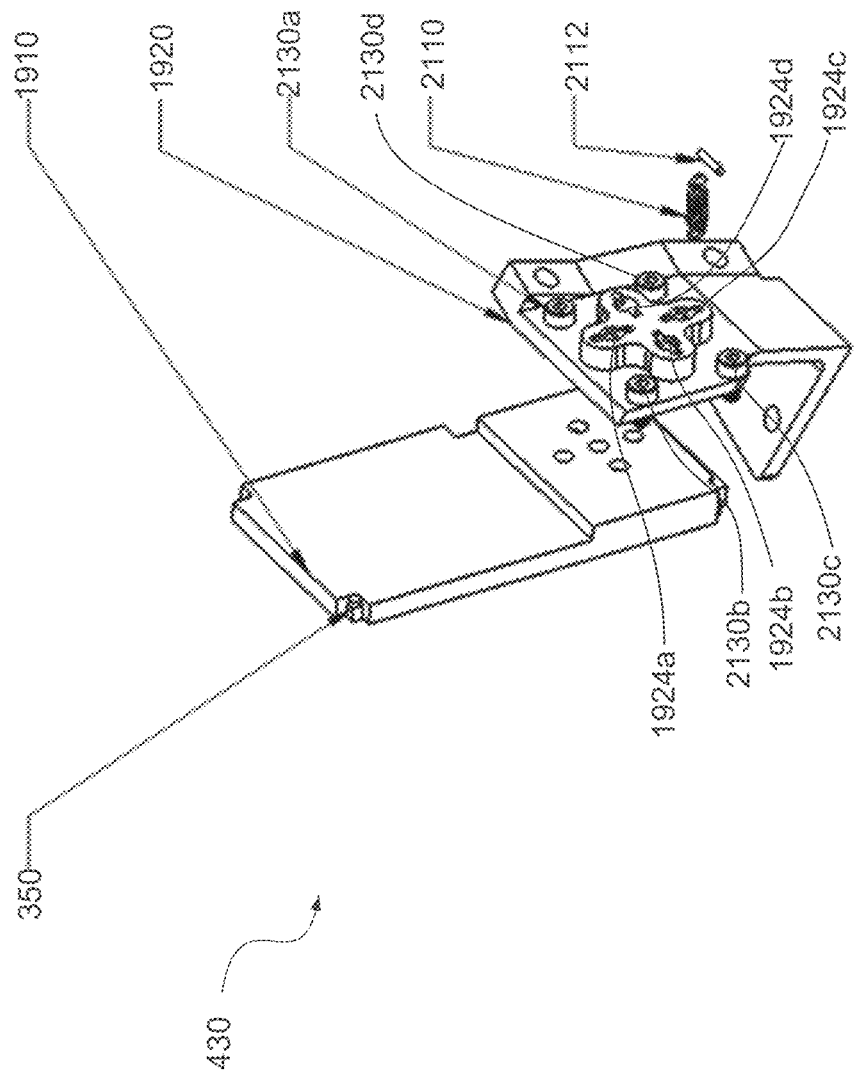
FIG. 21 illustrates another perspective view of the mirror assembly shown in FIG. 19.

FIG. 21 illustrates another perspective view of third unit 430 according to certain embodiments. As shown in FIG. 21, an elastic member 2110 is inserted in a bore in bores 1914a-1914d (shown in FIG. 19) and a bore in bores 1924a-1924d. In some embodiments, elastic member 2110 in the relaxed state is shorter than the total thickness of mirror bracket 1910 and bracket frame 1920, and elastic member 2110 has a hook at each end to hang on a dowel pin 2112. In this way, mirror bracket 1910 and bracket frame 1920 is securely coupled by the elastic force of elastic members 2110. In some embodiments, a countersink is formed around each of the openings of bores 1914a-1914d in receiving groove 1912 to make the countersink conform with the shape of dowel pin 2112, as shown in FIG. 19. In this way, dowel pins 2112 do not protrude into receiving groove 1912, thereby avoiding interference with the mirror received in receiving groove 1912. A countersink is formed around each of the openings of bores 1924a-1924d. The countersinks of bores 1924a-1924d conform with the shape of dowel pins 2112. In this way, dowel pins 2112 do not protrude from the surface of the boss 1926, thus avoiding possible interference with other components of the LiDAR system.

As shown in FIG. 21, third unit 430 includes screws 2130a-2130d inserted in bores 1928 (shown in FIG. 20) formed through bracket frame 1920. A screw 2130a, 2130b, 2130c, or 2130d is inserted in each bore 1928. Bores 1928 are formed with threads that can fit with screws 2130a-2130d. In the relaxed state, screws 2130a-2130d are longer than the thickness of the upper portion of bracket frame 1920. The distance and angle between mirror bracket 1910 and bracket frame 1920 can be adjusted through the four screws 2130a-2130d. Therefore, the orientation of the mirror received in receiving groove 1912 can be adjusted.

Figure 22:
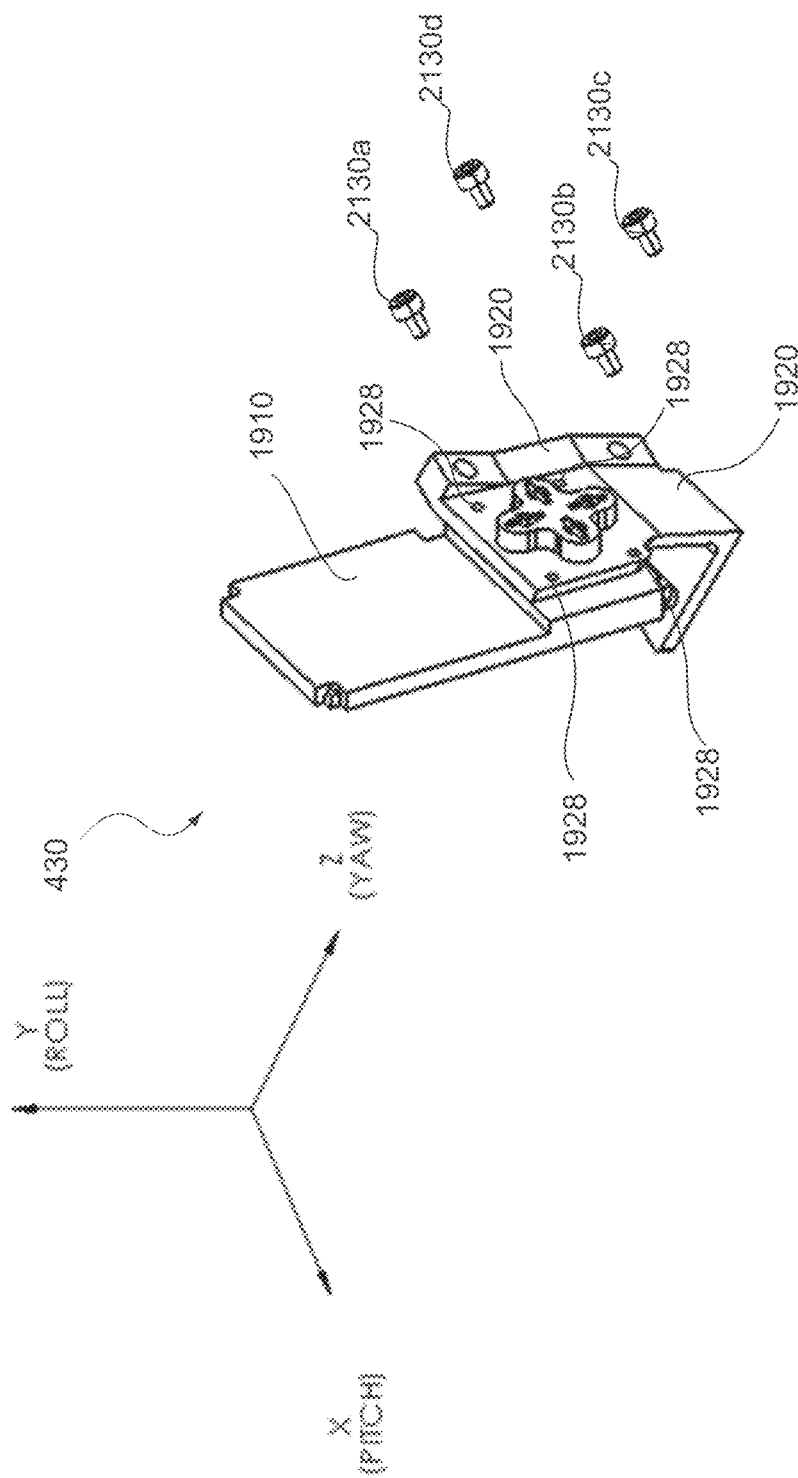
FIG. 22 illustrates a perspective view of the mirror assembly shown in FIG. 19.

FIG. 22 illustrates a perspective view of third unit 430 within a coordinate system according to certain embodiments. Adjustment of the orientation and location of mirror bracket 1910 with respect to bracket frame 1920 is described with reference to FIG. 22. If screws 2130a-2130d are all driven toward mirror bracket 1910, or are driven away from mirror bracket 1910, mirror bracket 1910 may have a translations substantially along the −z axis or z axis. In addition, an orientation of mirror bracket 1910 with respect to bracket frame 1920 may be achieved through driving screws 2130a-2130d. For example, screws 2130a and 2130b can be driven toward mirror bracket 1910 to increase the distance between mirror bracket 1910 and bracket frame 1920 around the locations of screws 2130a and 2130b, and thus mirror bracket 1910 may pivot around x axis in a first direction to increase the pitch angle. Similarly, screws 2130c and 2130d can be driven toward mirror bracket 1910 to increase the distance between mirror bracket 1910 and bracket frame 1920 around the locations of screws 2130c and 2130d, and thus mirror bracket 1910 may pivot around x axis in a second direction opposite to the first direction to reduce the pitch angle. Similarly, screws 2130a and 2130d can be driven toward mirror bracket 1910 to increase the distance between mirror bracket 1910 and bracket frame 1920 around the locations of screws 2130a and 2130d, and thus mirror bracket 1910 may pivot around y axis in a first direction to increase the roll angle. Similarly, screws 2130b and 2130c can be driven toward mirror bracket 1910 to increase the distance between mirror bracket 1910 and bracket frame 1920 around the locations of screws 2130b and 2130c, and thus mirror bracket 1910 may pivot around y axis in a second direction opposite to the first direction to decrease the roll angle.

Figure 23B:
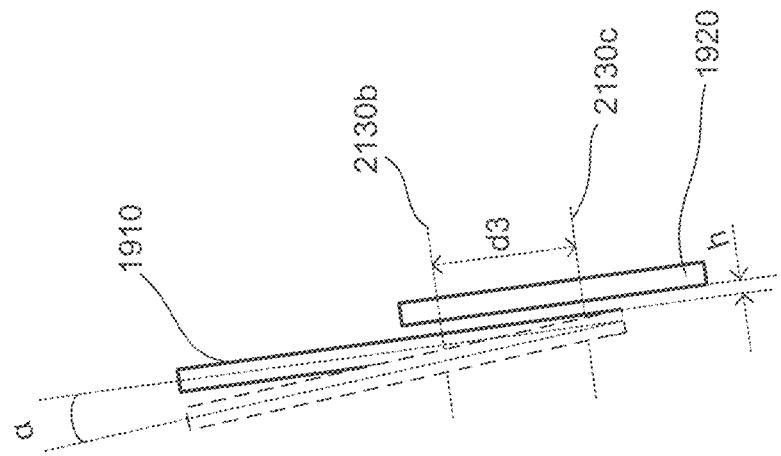
FIG. 23B illustrates the range of pitch angle adjustment in the mirror assembly shown in FIG. 19.
Figure 23A:
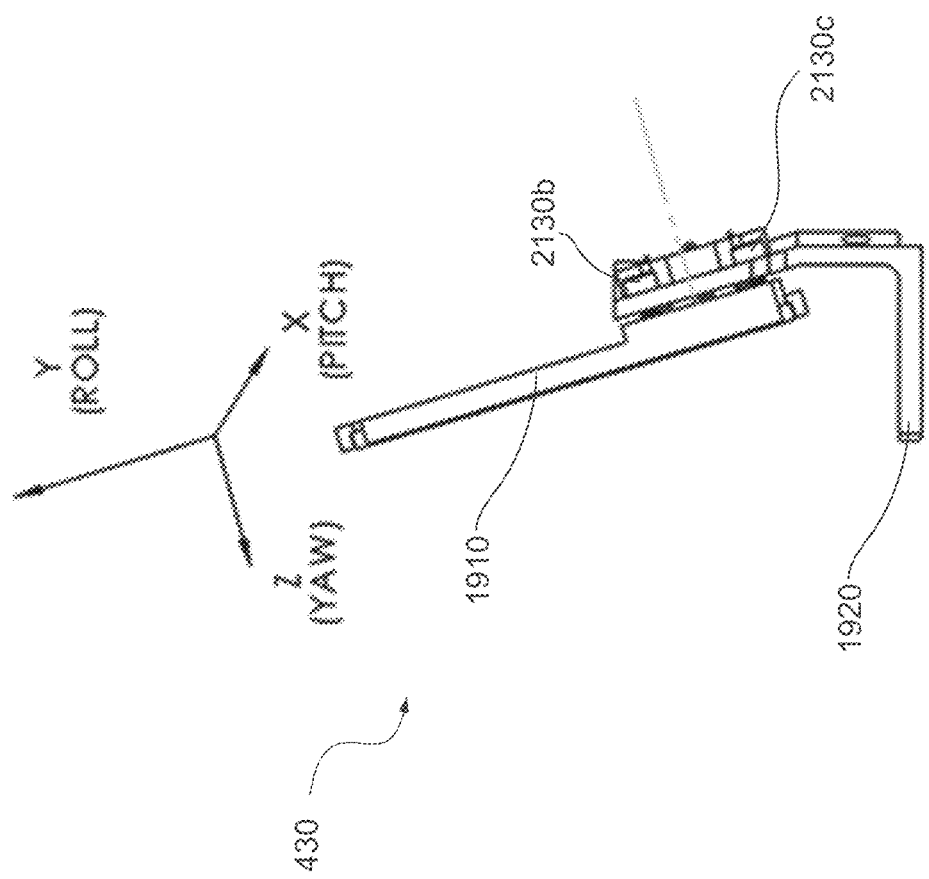
FIG. 23A illustrates a side view of the mirror assembly shown in FIG. 19.

FIG. 23A illustrates a perspective view of an example of third unit 430 according to certain embodiments. FIG. 23B illustrates the range of pitch angle adjustment in third unit 430. For convenience and clarity, FIG. 23B may not show all components of third unit 430, and relevant components involved may have been simplified. Adjustment of a pitch angle α of mirror bracket 1910 with respect to bracket frame 1920 is described with reference to FIGS. 23A-23B, together with FIG. 22. As shown in FIG. 23B, a pitch angle α around x axis between mirror bracket 1910 and bracket frame 1920 may be adjusted by driving screws 2130a (shown in FIG. 22) and 2130b. It is noted that mirror bracket 1910 may tilt with respect to bracket frame 1920 when only one of the screws 2130a and 2130b is driven, where a pitch angle α and a roll angle β may be adjusted concurrently. In a similar way, a pitch angle α between mirror bracket 1910 and bracket frame 1920 may be adjusted by driving screws 2130c and 2130d (shown in FIG. 22). For example, if the distance between mirror bracket 1910 and bracket frame 1920 can be adjusted by driving screws 2130a-2130d within a range of h (e.g., about ±1 mm), and the distance between the centers of screws 2130b and 2130c is d3 (e.g., about 21 mm), the maximum pitch angle α adjustment in the first direction achieved by driving screws 2130a and 2130b is about 5.44°. Similarly, the maximum pitch angle α adjustment in the second direction achieved by driving screws 2130c and 2130d is about −5.44° Therefore, the range of the pitch angle adjustment may be between, for example, about −5.44° and about +5.44°.

Figure 24B:
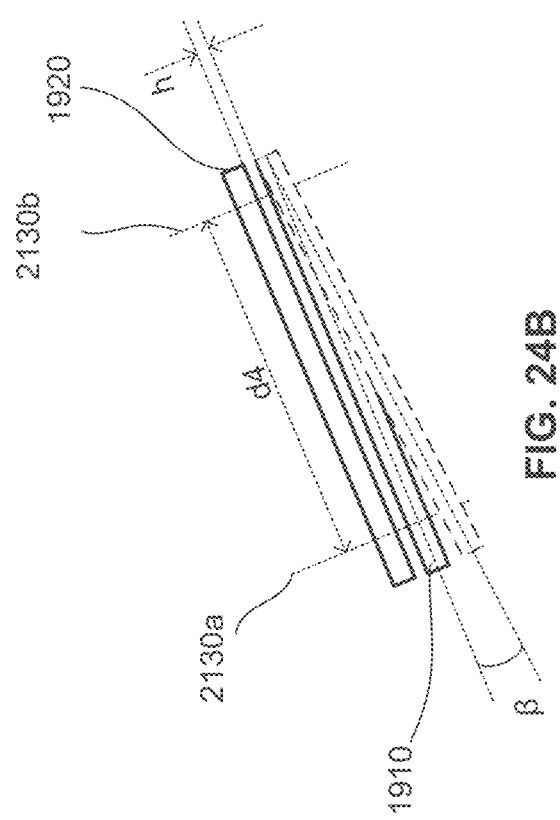
FIG. 24B illustrates the range of roll angle adjustment in the mirror assembly shown in FIG. 19.
Figure 24A:
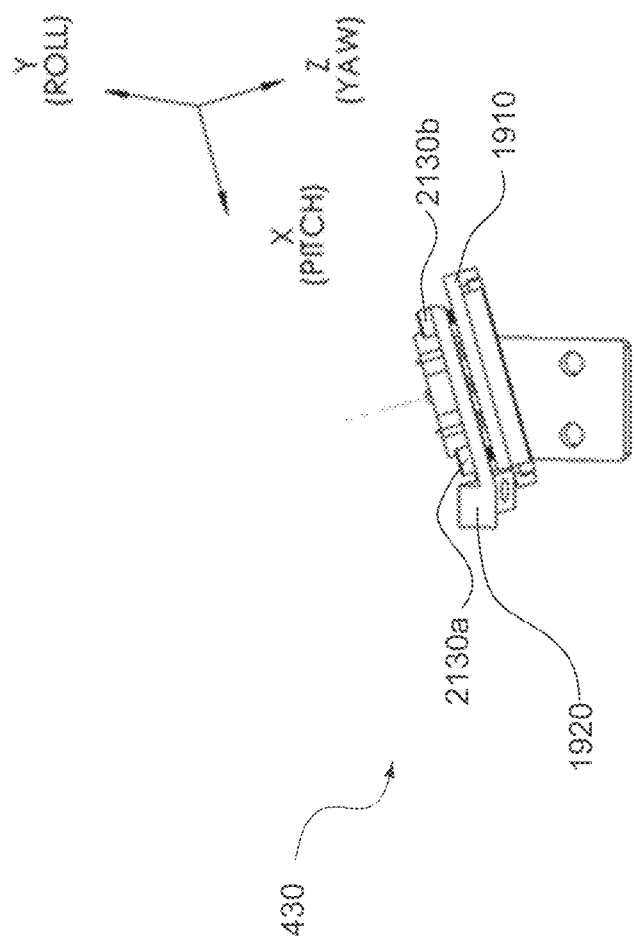
FIG. 24A illustrates another side view of the mirror assembly shown in FIG. 19.

FIG. 24A illustrates another perspective view of third unit 430 according to certain embodiments. FIG. 24B illustrates the range of roll angle adjustment in third unit 430. For convenience and clarity, FIG. 24B may not show all components of third unit 430, and relevant components involved may have been simplified. The adjustment to the roll angle β around y axis is described with reference to FIGS. 24A and 24B. As shown in FIG. 24B, a roll angle β between mirror bracket 1910 and bracket frame 1920 may be adjusted by driving screws 2130a and 2130d (shown in FIG. 22). It is noted that mirror bracket 1910 will tilt with respect to bracket frame 1920 if only one of the screws 2130a and 2130d is driven, that is, a pitch angle α and a roll angle β can be achieved concurrently. In a similar way, a roll angle β between mirror bracket 1910 and bracket frame 1920 may be adjusted by driving screws 2130b and 2130c (shown in FIG. 22). For example, if the distance between mirror bracket 1910 and bracket frame 1920 can be adjusted by driving screws 2130a-d within the range of h (e.g., about ±1 mm), and the distance between the centers of screws 2130a and 2130b is d4 (e.g., about 31.2 mm), the maximum roll angle β adjustment in the first direction achieved by driving screws 2130a and 2130d is about 3.66°. Similarly, the maximum roll angle β adjustment in the second direction achieved by driving screws 2130b and 2130c is about −3.66° Therefore, the range of the roll angle adjustment may be between, for example, about −3.66° and about +3.66°.

V. Receiver Assembly

Figure 25:
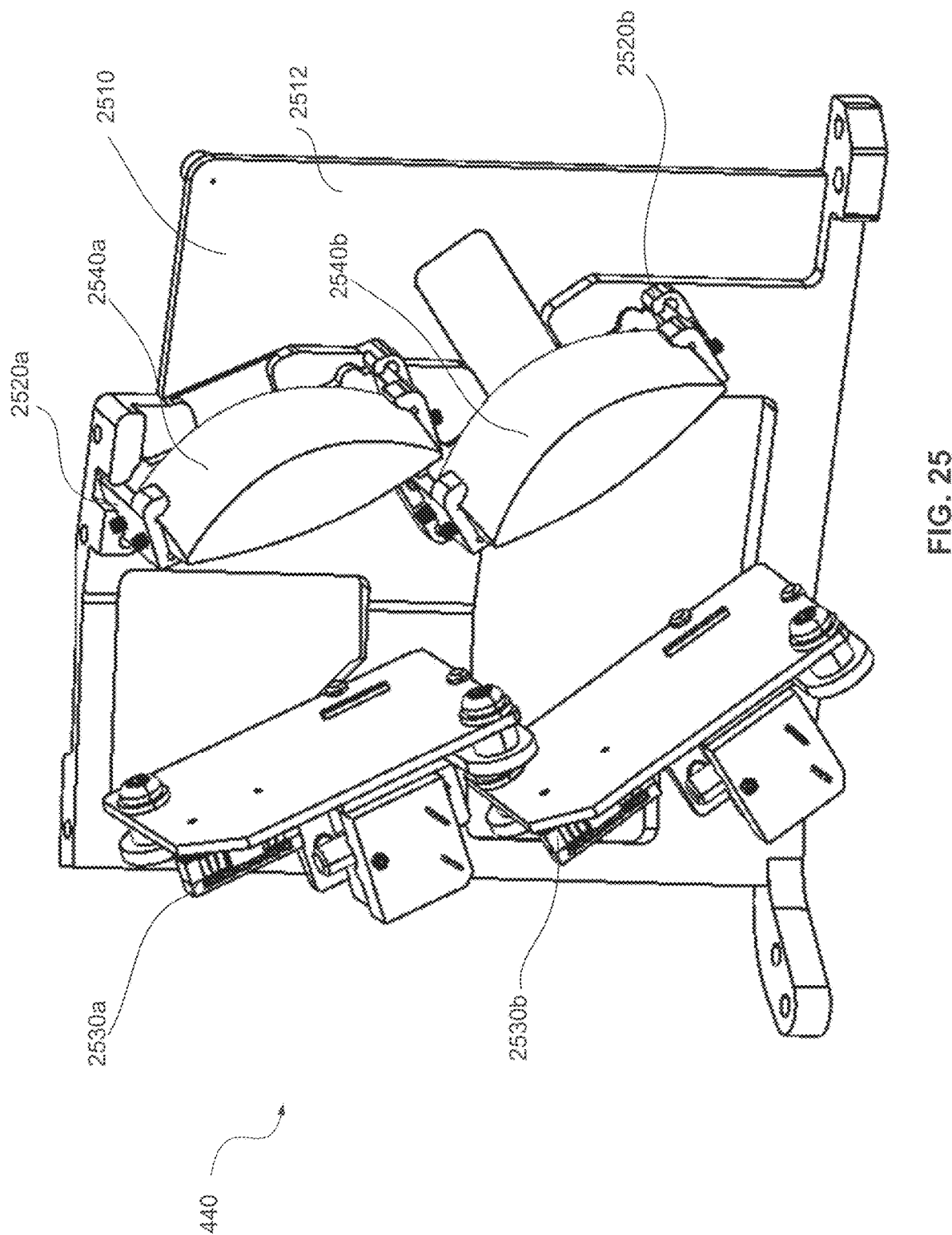
FIG. 25 illustrates an example of a receiver unit according to certain embodiments.

FIG. 25 illustrates an example of fourth unit 440 according to certain embodiments. As described above, in some embodiments, lens 360 and photodetector 370 shown in FIG. 3 can be mounted on fourth unit 440. In some embodiments, additional mirrors or other optical components can also be mounted on fourth unit 440 to change the direction of the light path of light beam 352 shown in FIG. 3 in order to minimize the size of the LiDAR system. In the example shown in FIG. 25, fourth unit 440 may include a carrier frame 2510 that is mounted on chassis 450 (shown in FIG. 4). Carrier frame 2510 may extends upright when assembled. Two lens mounts 2520a and 2520b may be mounted on a first side 2512 of carrier frame 2510. Lenses 2540a and 2540b may be mounted on lens mounts 2520a and 2520b, respectively. An example of lens mounts 2520a and 2520b is described in detail below. Fourth unit 440 may further include receiver assemblies 2530a and 2530b, where receiver assembly 2530a may be configured to face lens 2540a mounted on lens mount 2520a, and receiver assembly 2530b may be configured to face lens 2540b mounted on lens mount 2520b. An example of receiver assemblies 2530a and 2530b is described in detail below. In the example shown in FIG. 25, lens mount 2520a and lens mount 2520b may be similar in structure and function. Receiver assemblies 2530a and 2530b may also be similar in structure and function. For clarity, the description below may only refer to lens mount 2520a and receiver assembly 2530a.

Figure 26A:
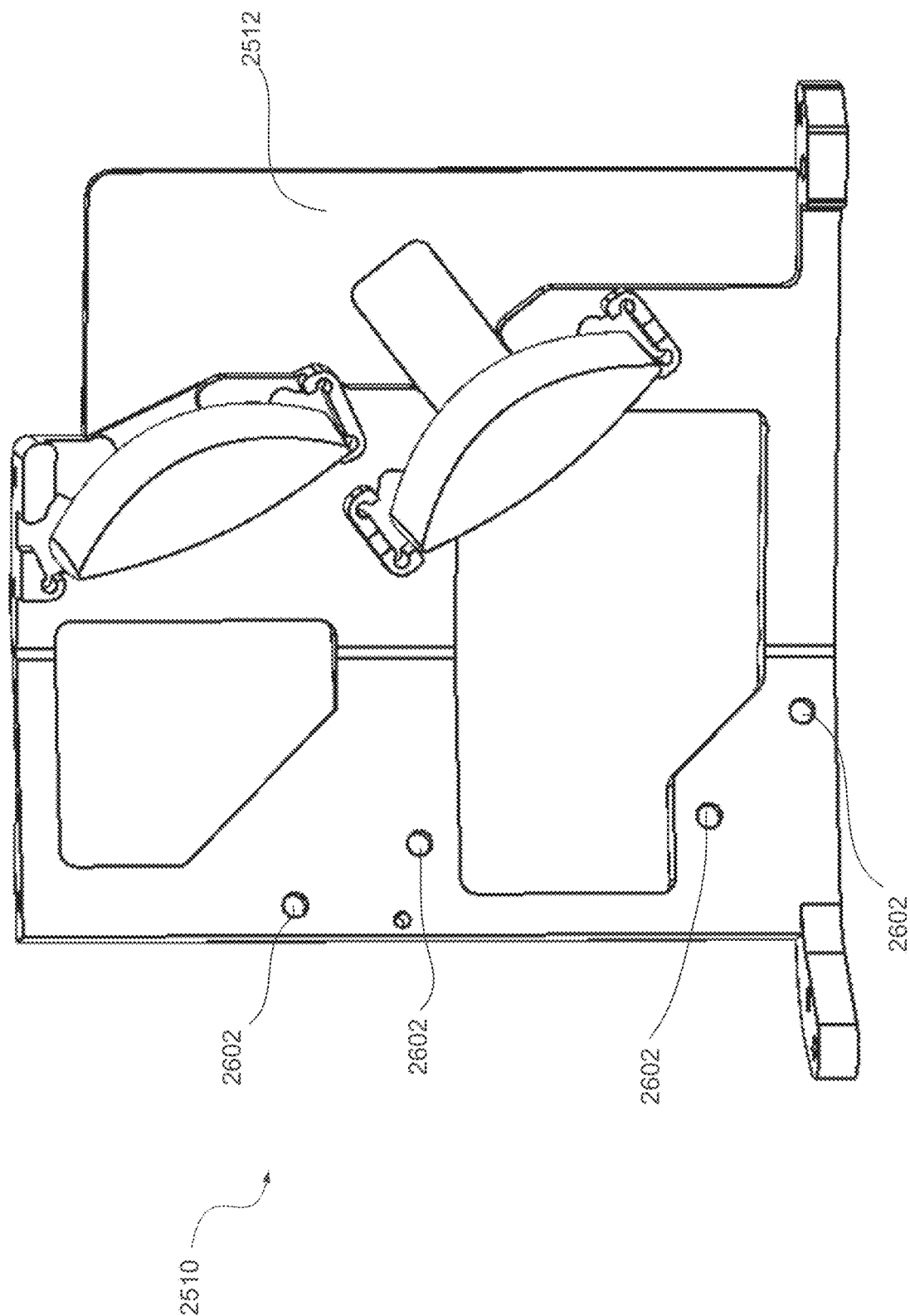

FIGS. 26A and 26B illustrate an example of a carrier frame (e.g., carrier frame 2510) for mounting lenses and photodetectors according to certain embodiments. FIG. 26A illustrates first side 2512 of carrier frame 2510. FIG. 26B illustrates an opposite second side 2514 of carrier frame 2510. In the example shown in FIG. 26A, carrier frame 2510 may include bores 2602 that can be used to secure receiver assemblies 2530a and 2530b, which are described in detail below. As shown in FIG. 26B, carrier frame 2510 may include countersink bores 2516a-2516d. Carrier frame 2510 may also include bores 2517. Lens mounts 2520a-2520b may be secured to carrier frame 2510 through countersink bores 2516a-2516d and may be adjusted through bores 2517 as described in detail below.

FIGS. 27A and 27B illustrate an example of lens mount 2520a in different perspective views according to certain embodiments. In the illustrated example, lens mount 2520a may be in a substantially C-shape, including a top lateral arm 2712, a connecting web 2714, and a bottom lateral arm 2716. Connecting web 2714 may include a countersink bore 2718 at each end of connecting web 2714. When lens mount 2520a is assembled with carrier frame 2510, countersink bore 2718 on lens mount 2520a may be aligned with countersink bore 2516 on carrier frame 2510. An elastic member 2717 (e.g., a wire spring or an extension spring) may be inserted in countersink bore 2718 and countersink bore 2516. Elastic member 2717 may have a hook on each end to hang on a dowel pin 2715. In the relaxed state, elastic member 2717 may be shorter than the sum of the thickness of carrier frame 2510 and the thickness of connecting web 2714. In this way, elastic member 2717 may impose an elastic force to secure lens mount 2520a to carrier frame 2510. Dowel pin 2715 on each end of elastic member 2717 may be received within the countersink of countersink bore 2718 or the countersink of countersink bore 2516, and thus may not protrude from the surface of connecting web 2714 of lens mount 2520a and second side 2514 of carrier frame 2510. In this way, dowel pin 2715 may not obstruct the optical path through lens mount 2520a.

Set screws 2518a and 2518b may extend through bores 2517. Set screws 2518a and 2518b may be longer than the thickness of carrier frame 2510. The distance between lens mount 2520a and carrier frame 2510 along the z axis (e.g., a direction normal to the first side 2512 of carrier frame 2510) can be adjusted by driving set screws 2518a and 2518b. For example, the distance may be increased when driving set screws 2518a and 2518b toward lens mount 2520a, and the distance may be decreased when driving set screws 2518a and 2518b away from lens mount 2520a. In this way, the alignment between the lens mounted on lens mount 2520a and the optical device (e.g., photodetector) mounted on receiver assembly 2530a (shown in FIG. 25) can be adjusted.

The orientation of lens mount 2520a with respect to carrier frame 2510 can also be adjusted by driving set screws 2518a and 2518b differently. For example, set screw 2518a may be driven to adjust the angle between lens mount 2520a and carrier frame 2510. In another example, two set screws 2518a and 2518b on two ends of connecting web 2714 of lens mount 2520a can be driven by different amounts to adjust the angle between lens mount 2520a and carrier frame 2510. For example, set screw 2518a can be driven toward lens mount 2520a, such that lens mount 2520a may rotate around the y axis in a first direction. If set screw 2518a is not driven and set screw 2518b is driven toward lens mount 2520a, lens mount 2520a may rotate around the y axis in a second direction opposite to the first direction. In this way, the orientation of the lens mounted on lens mount 2520a can be adjusted. In some embodiments, lens mount 2520a may include bores 2722 in top lateral arm 2712 and bottom lateral arm 2716. For example, there may be two bores 2722 in each of top later arm 2712 and bottom lateral arm 2716. A set screw 2711 may be inserted in each bore 2722 to secure the lens (e.g., lens 2540a shown in FIG. 25) on lens mount 2520a. As described above, lens mount 2520b may have a similar structure and include similar components as lens mount 2520a.

Figure 28:
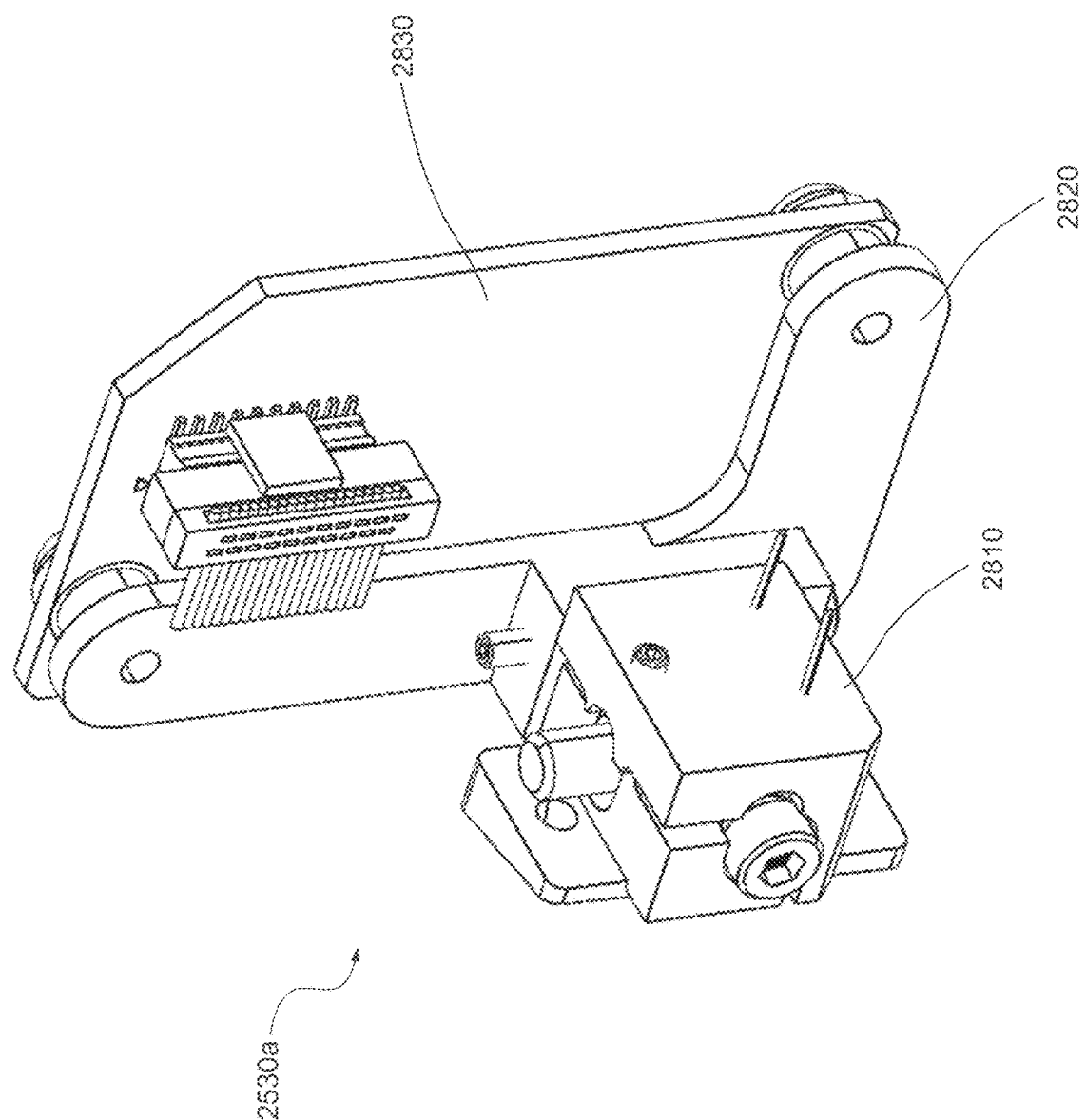
FIG. 28 illustrates an example of a receiver unit in a perspective view according to certain embodiments.

FIG. 28 illustrates an example of a receiver assembly (e.g., receiver assembly 2530a) in a perspective view according to certain embodiments. In the illustrated example, receiver assembly 2530a may include a hub 2810, a board mount 2820, and a circuit board 2830. Circuit board 2830 may include, for example, a photodetector, an image sensor, driver circuits, and the like installed thereon. Circuit board 2830 may be mounted on board mount 2820, which may be coupled to hub 2810 as described in detail below. Hub 2810 may be mounted on carrier frame 2510 and may be used to adjust the position of board mount 2820, and thus the position of circuit board 2830 as described in detail below.

Figure 29:
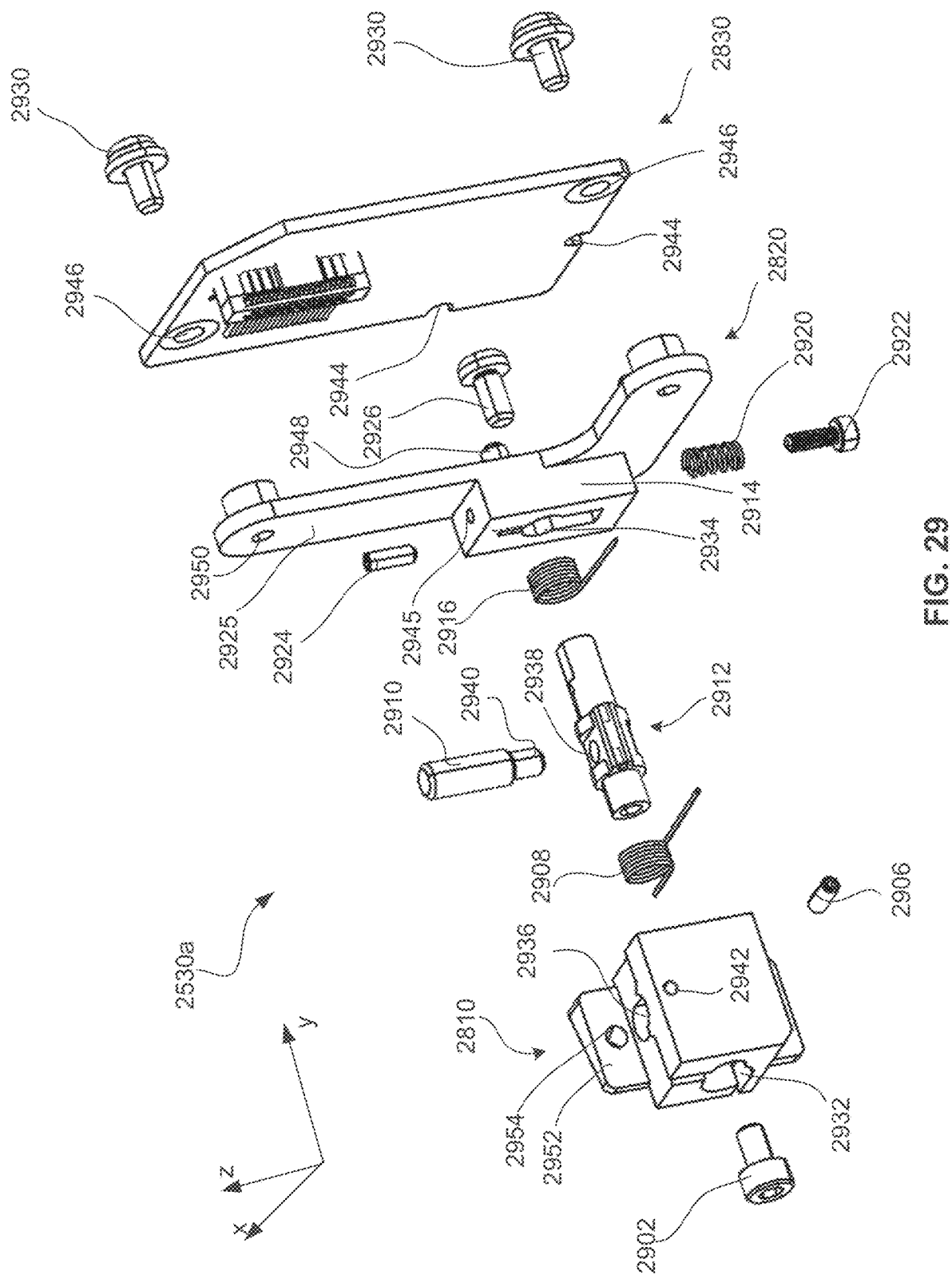
FIG. 29 illustrates an example of receiver unit in an exploded view according to certain embodiments.

FIG. 29 illustrates an example of receiver assembly 2530a in an exploded view. Receiver assembly 2530a may be secured to carrier frame 2510 such that the optical device mounted on receiver assembly 2530a, such as photodetector 370 shown in FIG. 3, may face lens 2540a as shown in FIG. 25. In the example shown in FIG. 29, receiver assembly 2530a may include hub 2810, in which a rotate shaft 2912 may be inserted. Rotate shaft 2912 may be used to drive board mount 2820, on which circuit board 2830 is mounted. An optical device, such as photodetector 370 (shown in FIG. 3) is mounted on circuit board 2830.

As shown in FIG. 29, hub 2810 may include a through bore 2932 along a longitudinal direction (e.g., the y axis). Board mount 2820 may include a through bore 2934, which may be aligned with through bore 2932 in hub 2810 when assembled. Rotate shaft 2912 may be inserted in through bore 2932 and through bore 2934. Receiver assembly 2530a may also include securing bolts 2902 and 2926. Securing bolt 2902 may be fitted to one end of rotate shaft 2912, and securing bolt 2926 may be fitted on the other end of rotate shaft 2912. Securing bolts 2902 and 2926 may rotatably secure rotate shaft 2912 such that rotate shaft 2912 can drive board mount 2820 to rotate around a central axis (e.g., the y axis) of rotate shaft 2912. Receiver assembly 2530a may also include elastic members 2908 and 2916, such as wire springs or torque springs. Elastic member 2908 may be sleeved on one end of rotate shaft 2912, and elastic member 2916 may be sleeved on the other end of rotate shaft 2912. Elastic members 2908 and 2916 may have opposite spiral directions so as to provide restoring forces on rotate shaft 2912. When rotate shaft 2912 is driven to rotate, elastic members 2908 and 2916 may have the tendency to restore the rotary position of rotate shaft 2912.

Hub 2810 may include a bore 2936 along a vertical direction (e.g., z direction) to provide a passage for a driving shaft 2910 to connect with rotate shaft 2912 when assembled. Rotate shaft 2912 may also include a bore 2938 formed along the vertical direction as shown in FIG. 29. An end 2940 of driving shaft 2910 may be inserted in bore 2938 when assembled. Hub 2810 may further include a bore 2942 formed at a top portion of hub 2810 along a lateral direction (e.g., x direction) as shown in FIG. 29. A set screw 2906 may be inserted in bore 2942 to drive driving shaft 2910 and thus drive rotate shaft 2912 to rotate board mount 2820.

Bore 2936 may be in an oblong shape to provide certain adjustment space. For example, set screw 2906 may be driven along the x axis to press against driving shaft 2910, which may drive rotate shaft 2912 to rotate around the y axis. The rotation of rotate shaft 2912 may rotate board mount 2820 around the y axis in a first direction. Set screw 2906 may also be driven along the −x axis to relax the compression against driving shaft 2910. The restoring force imposed by elastic members 2908 and 2916 may drive rotate shaft 2912 around the y axis, thus the rotation of rotate shaft 2912 may rotate board mount 2820 around the y axis in a second direction opposite to the first direction.

Board mount 2820 includes a bore (not shown in FIG. 29) formed along a vertical direction (e.g., z direction). A bolt 2922 is inserted in the bore with an elastic member 2920 sleeved on bolt 2922 to press against rotate shaft 2912 in the vertical direction (e.g., the z direction). Board mount 2820 includes a boss 2914 formed on a first side 2925 that is distant from circuit board 2830. A bore 2945 is formed in a top surface of boss 2914. A set screw 2924 is inserted in bore 2945 to adjust the vertical translation (along the z axis) of rotate shaft 2912 within bore 2934, hence adjust the vertical translation (along the z axis) of board mount 2820. For example, set screw 2924 may be driven to press against rotate shaft 2912 along −z axis. Board mount 2820 may translate along the z axis due to the counterforce imposed by rotate shaft 2912 because rotate shaft 2912 is secured to hub 2810, which is secured to carrier frame 2510 as shown in FIG. 4. If set screw 2924 is driven to relax the compression against rotate shaft 2912, board mount 2820 may translate along the −z axis due to elastic force imposed by elastic member 2920.

As shown in FIG. 29, circuit board 2830 includes two positioning notches 2944, each of which is aligned with one positioning pin 2948 on board mount 2820. Circuit board 2830 includes two bores 2946, each of which is aligned with a bore 2950 on board mount 2820 when assembled. Fastener 2930 may be inserted in bores 2946 and 2950 to secure circuit board 2830 to board mount 2820.

As shown in FIG. 29, hub 2810 may include an ear 2952 on each side along the vertical direction (e.g., the z axis). Ear 2952 on the bottom of hub 2810 is not shown. A bore 2954 is formed in ear 2952 along the x axis. As shown in FIG. 25, when assembling receiver assemblies 2530a-2530b to carrier frame 2510, bore 2954 shown in FIG. 29 and bore 2602 shown in FIG. 26A can be aligned with each other. A fastener (not shown) may be inserted in bore 2602 and bore 2954 to secure receiver assemblies 2530a-2530b to carrier frame 2510.

FIG. 30 illustrates an example of board mount 2820 in a perspective view. As shown in FIG. 30, board mount 2820 has a substantially L-shape with a long arm 3010 and a short arm 3020. Board mount 2820 includes studs 3006 on a second side 3002 that is facing circuit board 2830 (shown in FIG. 29) when assembled. Studs 3006 are formed at an end portion of long arm 3010 and an end portion of short arm 3020. Bore 2950 is formed in each stud 3006. In some embodiments, bore 2950 is a through bore. In some embodiments, bore 2950 is a blind bore. Board mount 2820 may include two positioning pins 2948 on second side 3002 at substantially the intersection of long arm 3010 and short arm 3020. Positioning pins 2948 may help appropriately position circuit board 2830 (shown in FIG. 29) with respect to board mount 2820.

Referring back to FIG. 29, adjustment of board mount 2820 with respect to the carrier frame 2510 is described. As described above, board mount 2820 may rotate around the central axis of the rotate shaft 2912 by driving set screw 2906. Therefore, the optical device on circuit board 2830, such as photodetector 370 as shown in FIG. 3, can rotate around the central axis of rotate shaft 2912. When receiver assembly 2530a and lens mount 2520a are secured to carrier frame 2510, the rotary alignment between photodetector 370 and lens 360 (shown in 3) can be adjusted. In addition, the vertical translation (e.g., along the z axis) of board mount 2820 with respect to rotate shaft 2912 can be achieved by driving set screw 2924. Therefore, the optical device on circuit board 2830, such as photodetector 370 as shown in FIG. 3 can have a vertical translation with respect to the carrier frame 2510 when assembled. When receiver assembly 2530a and lens mount 2520a are secured to carrier frame 2510, a vertical translation of photodetector 370 with respect to lens 360 (shown in FIG. 3) can be achieved. In some embodiments, receiver assembly 2530a and lens mount 2520a both form an angle with respect to horizontal direction as shown in FIG. 25. In these embodiments, the vertical translation (along z axis shown in FIG. 29) of board mount 2820 with respect to rotate shaft 2912 may cause the optical device on receiver assembly 2530a to have a horizontal and vertical translation components with respect to the lens on lens mount 2520a. Furthermore, as described above with reference to FIGS. 26-27B, the orientation of lens mount 2520a with respect to carrier frame 2510 can be adjusted by driving set screws 2518a-2518b (shown in FIG. 27B). Therefore, the orientation of the lens on lens mount 2520a with respect to the optical device on circuit board 2830 can be adjusted by driving set screws 2518a-2518b. The lateral translation (along z axis in FIG. 27B) of the lens on lens mount 2520a with respect to the optical device on circuit board 2830 can also be adjusted.

VI Spring-Loaded Post

The kinematic mount using elastic members (springs) as described above can achieve good alignment. In some embodiments, glue can be applied on the springs, the MEMS board, and the mount at the final step to fix the MEMS board. Since springs are flexible, a significant amount of glue may typically be applied to fill the clearance between the MEMS board and the mount. In some alternative embodiments, in order to further improve the stability of the whole application process and reduce the risk that the MEMS board may move out from its well aligned position caused by shrinking of glue, a post may be fitted over a spring to form a spring-loaded post. Since the glue is applied on the external surfaces of the spring-loaded posts instead of on the flexible springs directly, the amount of glue needed to fill the clearances can be significantly reduced and the stability of the MEMS board can be improved.

Figure 31A:
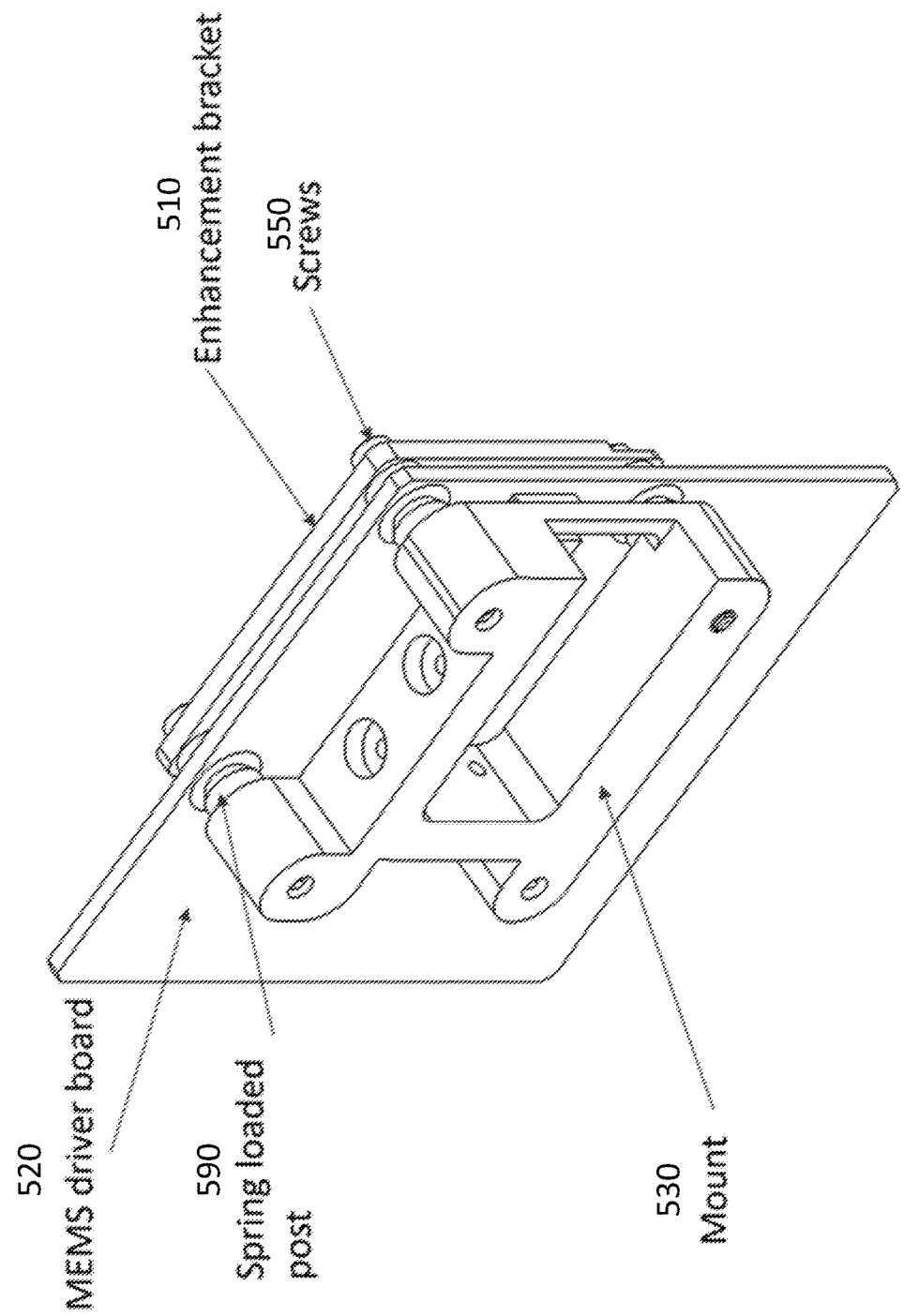
FIG. 31A illustrates an exemplary isometric view of a MEMS board assembly, according to certain embodiments.

FIG. 31A illustrate an exemplary MEMS board assembly 500 in a LiDAR system. As shown in in FIG. 31A, system 500 may be used to align a MEMS driver board 520 with mount 530. As an example, MEMS driver board 520 may be MEMS board 520 illustrated in FIG. 7. In some embodiments, system 500 may include an enhancement bracket 510, a plurality of screws 550, and a plurality of spring-loaded posts 590. In some embodiments, enhancement bracket 510 may have a plurality of through holes corresponding to a plurality of through holes in MEMS driver board. Mount 530 may have a plurality of threaded holes corresponding to the through holes of enhancement bracket 510 and MEMS driver board 520 such that they could be aligned when fitting mount 530 and enhancement bracket 510 to MEMS driver board 520. For example, screws 550 may fit enhancement bracket 510 to MEMS driver board 520 by reaching into the plurality of threaded holes of the mount 530 through the plurality of through holes in enhancement bracket 510 and a plurality of through holes in MEMS driver board 520 respectively. In some embodiments, spring-loaded posts 590 may be placed between mount 530 and MEMS driver board 520 to reduce the surface area that needs to be filled with glue at the end.

Figure 31B:
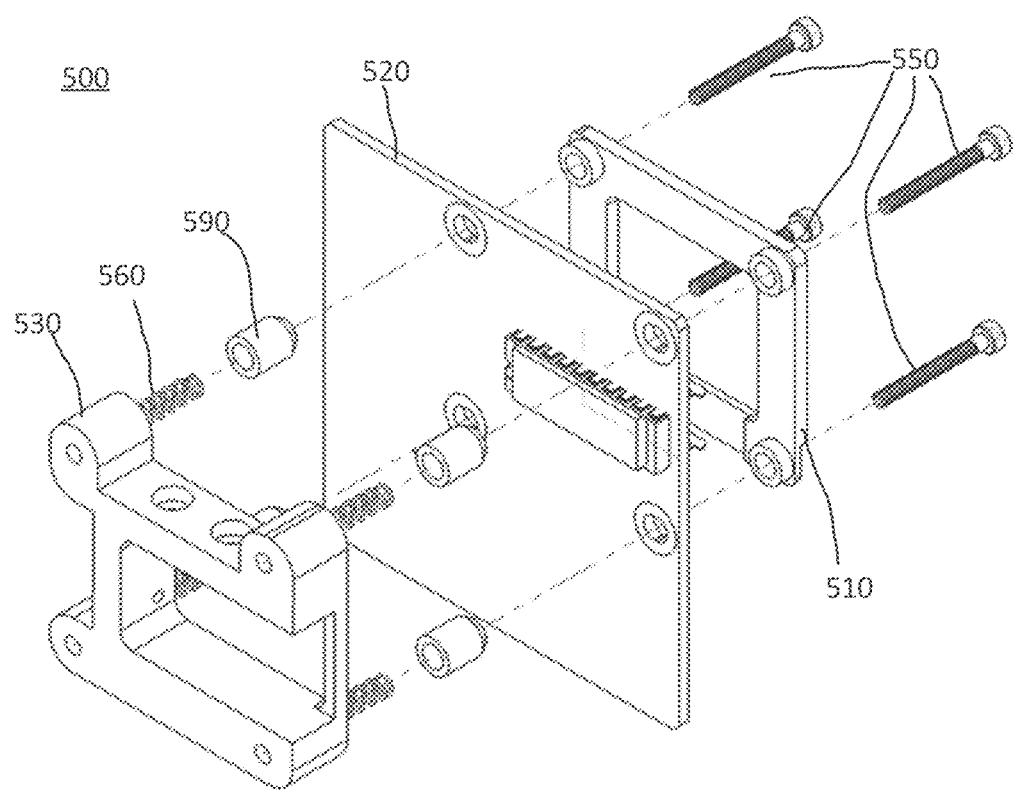
FIG. 31B illustrate an exploded view of the MEMS board assembly as shown in FIG. 31A, according to certain embodiments.
Figure 31C:
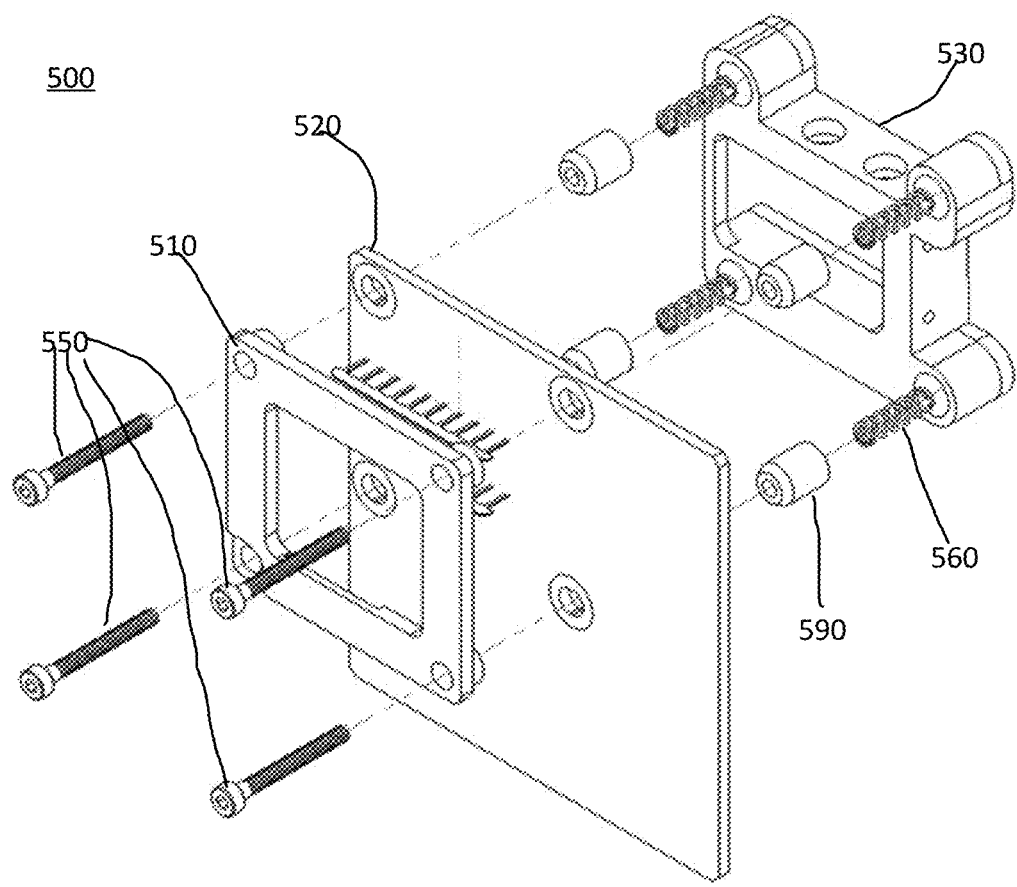
FIG. 31C illustrate an exploded view of the MEMS board assembly as shown in FIG. 31A, in a different direction of view, according to certain embodiments.

FIGS. 31B and 31C illustrate exploded views of MEMS board assembly 500 as shown in FIG. 31A. As shown by FIG. 31B, each spring-loaded post 590 is formed by fitting a spring 560 into a respective post. The post may cover spring 560 so that an entire length of spring 560 is in the post and not exposed. In some embodiments, spring-loaded posts 590 may have a thickness to allow a space between mount 530 and MEMS driver board 520 to accommodate components, e.g., IC chips, mounted on MEMS driver board 520 when mount 530 and MEMS driver board 520 are fitted together. For example, each spring-loaded post 590 may have a thickness of 2-3 mm.

Spring-loaded posts 590 may be aligned with and fitted into the respective threaded holes of mount 530. In some embodiments, system 500 may include four spring-loaded posts 590 each fitted to a corner of mount 530 respectively. It is contemplated that system 500 may include more or less spring-loaded posts 590 according to the number of threaded holes in mount 530. The number of spring-loaded posts 590 may be equal to or less than the number of threaded holes in mount 530. In some embodiments, each spring-loaded post 590 may be partially fitted into the corresponding threaded hole of mount 530. In some embodiments, spring-loaded posts 590 may also be aligned with the respective through holes of MEMS driver 520. For example, MEMS driver board 520 may be moved until it touches spring-loaded posts 590 at the respective through holes in MEMS driver board 520 corresponding to the threaded holes of mount 530 respectively.

As shown by FIGS. 31B and 31C, screws 550 may reach through a plurality of through holes in enhanced bracket 510 and the plurality of through holes in MEMS driver board 520 respectively. In some embodiments, screws 550 may further reach into the plurality of threaded holes of mount 530 through the plurality of spring-loaded posts 590 and respective springs 560 inside spring-loaded posts 590. The position of MEMS driver board 520 can be adjusted by turning/fastening screws 550 such that screws 550 thread into mount 530. Fastening screws 550 may compress springs 560 to create a pressure between mount 530 and MEMS driver board 520 so that the fitting is more stable yet sufficiently flexible. In some embodiments, screws 550 may be fine-tuned such that MEMS driver board 520 is adjusted to a target position. The target position may be predetermined and preprogrammed into the controller controlling the fastening of screws 550.

Figure 32A:
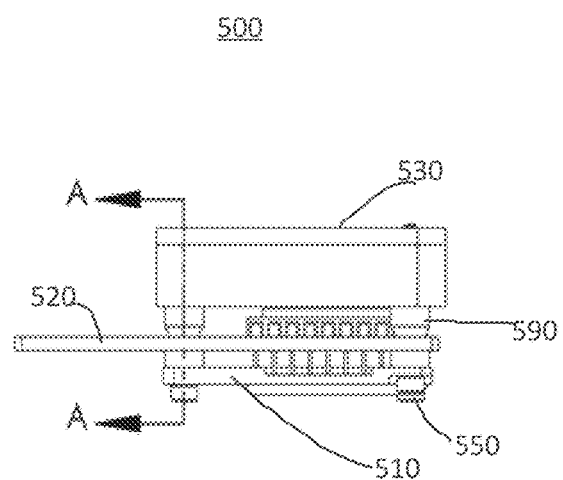
FIG. 32A illustrates a side view of the MEMS board assembly as shown in FIG. 31A, according to certain embodiments.
Figure 32B:
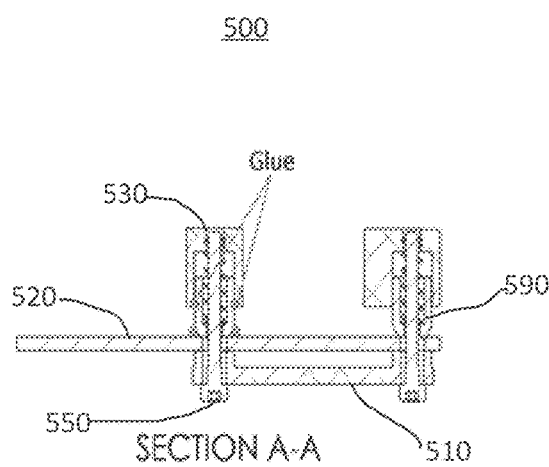
FIG. 32B illustrates a sectional view of the MEMS board assembly as shown in FIG. 32A along the line A-A, according to certain embodiments.

FIGS. 32A and 32B illustrate side and sectional views of MEMS board assembly 500 as shown in FIG. 31A. As shown in FIGS. 32A and 32B, after screws 550 are fastened and MEMS driver board 520 is adjusted to its target position, MEMS driver board 520 and mount 530 are separated by spring-loaded posts 590. As shown by FIG. 32B, clearances are formed between spring-loaded posts 590 and MEMS board 520 and between spring-loaded posts 590 and mount 530 at the respective places where spring-loaded posts 590 touch MEMS board 520 and mount 530. In some embodiments, because spring-loaded posts 590 provides rigid support between MEMS board 520 and mount 530, MEMS driver board 520 can be secured at the target position by applying elastic filling materials, such as glue, only on external surfaces at these small clearances rather than along the entire posts.

By using spring-loaded posts 590, the areas to which the filling material needs to be applied in order to secure MEMS driver board 520 may be sufficiently small. For example, in certain embodiments, the clearances may be in the range of 0.1-0.2 mm. As a result, the amount of filling materials needed for securing MEMS driver board 520 to mount 530 can also be reduced.

Figure 33:
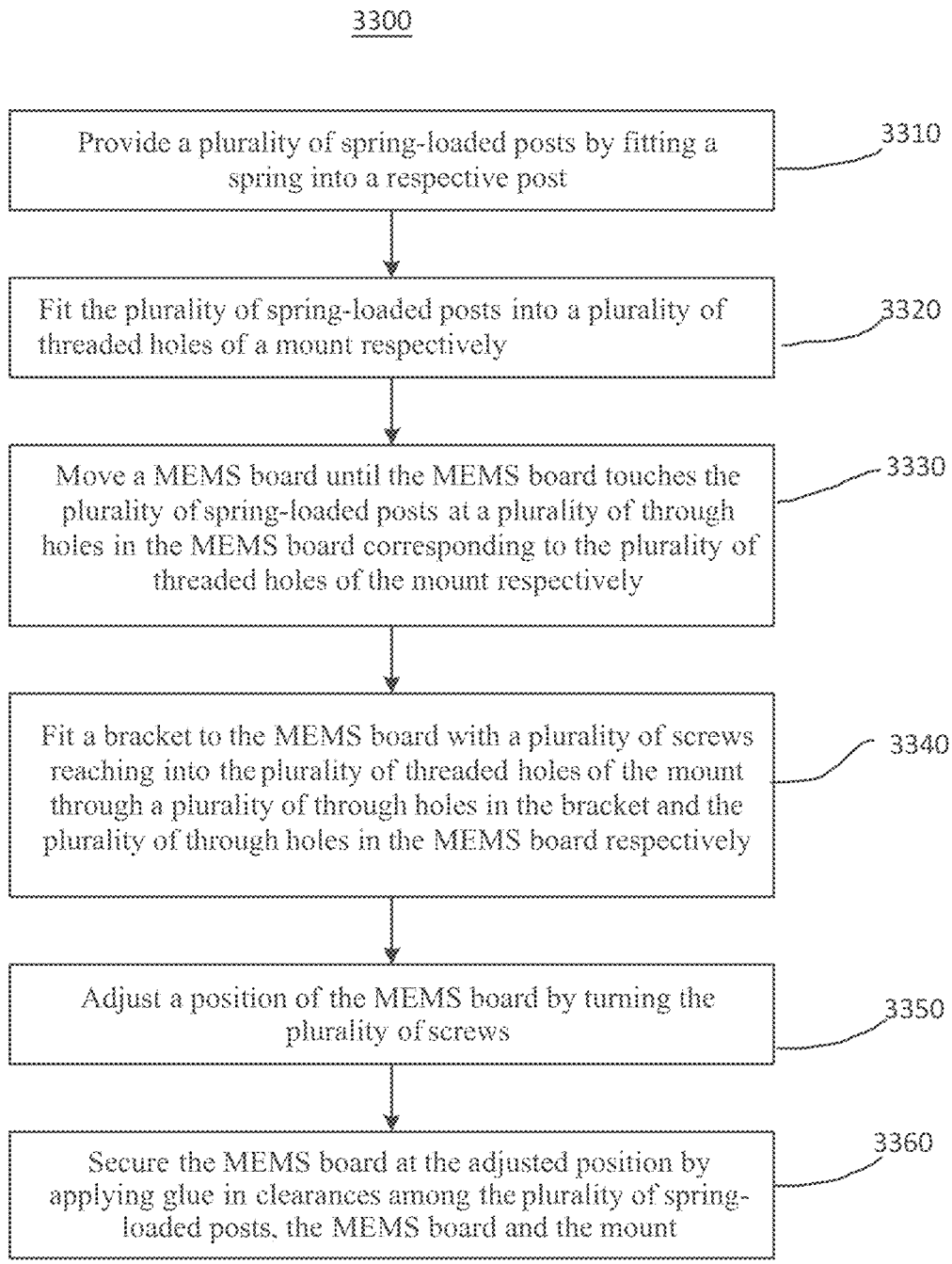
FIG. 33 illustrates a flowchart of an exemplary method of making a MEMS board assembly, according to certain embodiments.

FIG. 33 illustrates a flowchart of an exemplary method 3300 of making a MEMS board assembly, according to embodiments of the disclosure. In some embodiments, method 3300 may be performed to align a MEMS board (e.g., MEMS driver board 520 shown in FIGS. 31A-31C) and a mount (e.g., mount 530). In some embodiments, method 3300 may be performed by a LiDAR manufacture to make a MEMS board assembly to be used in a LiDAR system. Method 3300 may be performed by a worker with the assistance of machines and tools or automatically by a robotic machine controlled by a preprogramed controller. As shown in FIG. 33, method 3300 may include steps 3310-3360. However, it is contemplated that method 3300 could include more or less steps than shown in FIG. 33.

At step 3310, a plurality of spring-loaded posts, such as spring-loaded posts 590 shown in FIGS. 31A-31C, may be provided. In some embodiments, each spring-loaded post may be formed by fitting a spring 560 into a respective post. In some embodiments, spring-loaded posts 590 may have a thickness of 2-3 mm to allow a space between mount 530 and MEMS driver board 520. In some embodiments, the thickness of spring-loaded posts may be determined based on the clearance necessary to accommodate components, e.g., IC chips, mounted on MEMS driver board 520 when mount 530 and MEMS driver board 520 are fitted together.

At step 3320, the plurality of spring-loaded posts may be fitted into a plurality of threaded holes of the mount respectively. In some embodiments, as shown in FIGS. 32A and 32B, spring-loaded posts 590 may be aligned with and fitted into the respective threaded holes of mount 530. In some embodiments, each spring-loaded post 590 may be partially fitted into the corresponding threaded hole of mount 530, so that only a portion of each spring-loaded post 590 is exposed. As shown by FIG. 32B, clearances may be formed at the places where spring-loaded posts 590 connect with mount 530. In some embodiments, system 500 may include four spring-loaded posts 590 each fitted to a corner of mount 530 respectively although other suitable numbers of posts can be used depending on the design of the mount.

At step 3330, a MEMS board may be moved until the MEMS board touches the plurality of spring-loaded posts at a plurality of through holes in the MEMS board corresponding to the plurality of threaded holes of the mount respectively. In some embodiments, as shown in FIGS. 31A-31C, MEMS driver board 520 may include multiple through holes corresponding to the threaded holes of mount 530. MEMS driver board 520 may be aligned with mount 530 by having the through holes touch the spring-loaded posts 590 fitted in the corresponding threaded holes of mount 530. In some embodiments, one end of spring-loaded posts 590 may be shaped to partially fit in the through holes of MEMS driver board 520.

At step 3340, a bracket may be further fitted to the MEMS board with a plurality of screws reaching into the plurality of threaded holes of the mount through a plurality of through holes in the bracket and the plurality of through holes in the MEMS board respectively. In some embodiments, as shown in FIGS. 31A-31C, enhancement bracket 510 may be fitted to MEMS driver board 520. Enhancement bracket 510 may have multiple through holes corresponding the through holes of MEMS driver board 520. In some embodiments, screws 550 may be first applied through the through holes of enhancement bracket 510 and then the through holes of MEMS driver board 520, before they reach into the plurality of threaded holes of the mount 530 through spring-loaded posts 590.

At step 3350, a position of the MEMS board may be adjusted by turning the plurality of screws. In some embodiments, as shown in FIGS. 31A-31C, the position of MEMS board 520 can be adjusted by turning/fastening screws 550 such that screws 550 thread into mount 530. In some embodiments, screws 550 may be fine-tuned such that MEMS driver board 520 is adjusted to a target position. The target position may be predetermined and preprogram into the controller controlling the fastening of screws 550. Screws 550 may compress springs 560 to create a pressure between mount 530 and MEMS driver board 520 so that the fitting is more stable and flexible. As shown by FIG. 32B, after the adjustment, clearances may be formed at the places where spring-loaded posts 590 connect with MEMS driver board 520.

At step 3360, the MEMS board may be secured at the adjusted position (e.g., the target position) by applying elastic filling material(s) in clearances among the plurality of spring-loaded posts, the MEMS board and the mount. In some embodiments, the elastic filling material applied may be glue. Elastic filling material can provide flexibility when securing the MEMS board. In some embodiments, as shown in FIG. 32B, the elastic filling material can be applied at the external surfaces of the small clearances between spring-loaded posts 590 and MEMS board 520 and between spring-loaded posts 590 and mount 530. As the clearances may be in the range of 0.1-0.2 mm, only a limited amount of elastic filling material needs to be applied. As a result, the MEMS board assembly made by method 3300 is more stable and less likely slip out of alignment. It is also less impacted by the shrinking or expansion of the filling material due to the small amount applied.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter. The various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art. Indeed, the methods and systems described herein may be embodied in a variety of other forms; furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure.

Although the present disclosure provides certain example embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provide a result conditioned on one or more inputs. Suitable computing devices include multi-purpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example.

The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Similarly, the use of "based at least in part on" is meant to be open and inclusive, in that a process, step, calculation, or other action "based at least in part on" one or more recited conditions or values may, in practice, be based on additional conditions or values beyond those recited. Headings, lists, and numbering included herein are for ease of explanation only and are not meant to be limiting.

The various features and processes described above may be used independently of one another, or may be combined in various ways. All possible combinations and sub-combinations are intended to fall within the scope of the present disclosure. In addition, certain method or process blocks may be omitted in some embodiments. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed examples. Similarly, the example systems and components described herein may be configured differently than described. For example, elements may be added to, removed from, or rearranged compared to the disclosed examples.

What is claimed is:

1. A MEMS board assembly, comprising:
    a MEMS board having a plurality of through holes;
    a mount having a plurality of threaded holes;
    a plurality of spring-loaded posts each formed by fitting a spring into a respective post, wherein the plurality of spring-loaded posts are fitted into the plurality of threaded holes of the mount; and
    a plurality of screws fitting the MEMS board to the mount by reaching into the plurality of threaded holes of the mount through the plurality of through holes in the MEMS board and the plurality of spring-loaded posts, wherein the MEMS board touches the plurality of spring-loaded posts at the plurality of through holes in the MEMS board corresponding to the plurality of threaded holes of the mount respectively,
    wherein the MEMS board and the mount are separated by the spring-loaded posts after the MEMS board is fitted to the mount by the plurality of screws.

2. The MEMS board assembly of claim 1, further comprising a bracket, wherein the plurality of screws further fits the bracket to the MEMS board by reaching through a plurality of through holes of the bracket before reaching through the plurality of through holes of the MEMS board.

3. The MEMS board assembly of claim 1, wherein the MEMS board is adjusted to a target position by turning the plurality of screws.

4. The MEMS board assembly of claim 3, further comprising means for securing the MEMS board at the target position.

5. The MEMS board assembly of claim 4, wherein the means for securing the MEMS board at the target position includes glue applied in clearances among the plurality of spring-loaded posts, the MEMS board or the mount.

6. The MEMS board assembly of claim 5, wherein the clearances are in a range of 0.1-0.2 mm.

7. The MEMS board assembly of claim 1, wherein the mount is rectangular or square, wherein the plurality of spring-loaded posts include four spring-loaded posts each fitted to a corner of the mount respectively.

8. The MEMS board assembly of claim 1, wherein each of the plurality of spring-loaded posts has a thickness of 2-3 mm.

9. A MEMS board assembly made by a method for aligning a MEMS board with a mount, wherein the method comprises:
fitting a plurality of spring-loaded posts into a plurality of threaded holes of the mount respectively, wherein each spring-loaded post is formed by fitting a spring into a respective post;
fitting the MEMS board to the mount with a plurality of screws reaching into the plurality of threaded holes of the mount through a plurality of through holes in the MEMS board and the plurality of spring-loaded posts; and
adjusting the MEMS board to a target position by turning the plurality of screws,
wherein the MEMS board and the mount are separated by the spring-loaded posts after the MEMS board is adjusted to the target position.

10. The MEMS board assembly of claim 9, wherein the method further comprises:
fitting a bracket to the MEMS board by applying the plurality of screws through a plurality of through holes of the bracket before applying the plurality of screws through the plurality of through holes of the MEMS board.

11. The MEMS board assembly of claim 9, wherein the method further comprises:
securing the MEMS board at the target position.

12. The MEMS board assembly of claim 11, wherein securing the MEEMS board further comprises:
applying glue in clearances among the plurality of spring-loaded posts, the MEMS board or the mount.

13. The MEMS board assembly of claim 12, wherein the clearances are in range of 0.1-0.2 mm.

14. The MEMS board assembly of claim 9, wherein the method further comprises:
fitting the plurality of spring-loaded posts into the plurality of threaded holes of the mount.

15. The MEMS board assembly of claim 9, wherein the method further comprises:
moving the MEMS board until the MEMS board touches the plurality of spring-loaded posts at the plurality of through holes in the MEMS board corresponding to the plurality of threaded holes of the mount, respectively.

16. A LiDAR system, comprising:
a transmitter configured to emit a light beam to scan an object; and
a receiver configured to detect the light beam returned by the object,
wherein at least one of the transmitter or the receiver includes a MEMS board assembly, comprising:
a MEMS board having a plurality of through holes;
a mount having a plurality of threaded holes;
a plurality of spring-loaded posts each formed by fitting a spring into a respective post, wherein the plurality of spring-loaded posts are fitted into the plurality of threaded holes of the mount; and
a plurality of screws fitting the MEMS board to the mount by reaching into the plurality of threaded holes of the mount through the plurality of through holes in the MEMS board and the plurality of spring-loaded posts, wherein the MEMS board touches the plurality of spring-loaded posts at the plurality of through holes in the MEMS board corresponding to the plurality of threaded holes of the mount respectively,
wherein the MEMS board and the mount are separated by the spring-loaded posts after the MEMS board is fitted to the mount by the plurality of screws.

17. The LiDAR system of claim 16, wherein the MEMS board assembly further comprises glue applied in clearances among the plurality of spring-loaded posts, the MEMS board or the mount, for securing the MEMS board at a target position.

18. The LiDAR system of claim 17, wherein the clearances are in range of 0.1-0.2 mm.

19. The LiDAR system of claim 16, wherein the mount is rectangular or square, wherein the plurality of spring-loaded posts include four spring-loaded posts each fitted to a corner of the mount respectively.

20. The LiDAR system of claim 16, wherein the MEMS board assembly further comprises a bracket, wherein the plurality of screws further fits the bracket to the MEMS board by reaching through a plurality of through holes of the bracket before reaching through the plurality of through holes of the MEMS board.

* * * * *